(12) United States Patent
Sano

(10) Patent No.: US 6,564,353 B2
(45) Date of Patent: May 13, 2003

(54) METHOD AND APPARATUS FOR DESIGNING A CLOCK DISTRIBUTING CIRCUIT, AND COMPUTER READABLE STORAGE MEDIUM STORING A DESIGN PROGRAM

(75) Inventor: Masahiro Sano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/983,185

(22) Filed: Oct. 23, 2001

(65) Prior Publication Data

US 2002/0199158 A1 Dec. 26, 2002

(30) Foreign Application Priority Data

Jun. 13, 2001 (JP) ........................ 2001-178295

(51) Int. Cl.[7] .............................................. G06F 17/50
(52) U.S. Cl. ...................... 716/2; 716/6; 716/7; 716/10
(58) Field of Search ............................................. 716/2

(56) References Cited

U.S. PATENT DOCUMENTS

| 5,519,351 A | * | 5/1996 | Matsumoto ................. 327/293 |
| 5,557,779 A | * | 9/1996 | Minami .......................... 716/6 |
| 5,798,935 A | * | 8/1998 | Doreswamy et al. ....... 714/700 |
| 5,974,245 A | * | 10/1999 | Li et al. ........................ 716/10 |
| 6,043,704 A | * | 3/2000 | Yoshitake ................... 327/295 |
| 6,053,950 A | * | 4/2000 | Shinagawa .................... 703/19 |
| 6,266,803 B1 | * | 7/2001 | Scherer et al. ................ 716/10 |
| 6,367,051 B1 | * | 4/2002 | Pileggi et al. .................. 716/2 |

FOREIGN PATENT DOCUMENTS

| JP | 2-62675 | 3/1990 |
| JP | 8-44776 | 2/1996 |
| JP | 8-50604 | 2/1996 |
| JP | 8-129571 | 5/1996 |

* cited by examiner

*Primary Examiner*—Matthew Smith
*Assistant Examiner*—Andrea Liu
(74) *Attorney, Agent, or Firm*—Staas & Halsey LLP

(57) ABSTRACT

The present invention is a method that can simultaneously and reliably optimize the clock propagation delay time and clock skew of the entire semiconductor integrated circuit. For this reason, in the present invention, a clock-supplying element and a plurality of clock-receiving elements are first disposed. Then, a wiring path is determined while adjusting both a wired state and a buffer-inserting position from the clock-receiving elements toward the clock-supplying element. Such a method according to the present invention is employed, for example, in the layout of a semiconductor integrated circuit such as an integrated circuit, a large-scale integration, etc. Particularly, it is employed in the automatic layout of a clock distributing circuit.

27 Claims, 15 Drawing Sheets

CLK

CLK

CLK

CLK

METHOD AND APPARATUS FOR DESIGNING A CLOCK DISTRIBUTING CIRCUIT, AND COMPUTER READABLE STORAGE MEDIUM STORING A DESIGN PROGRAM

This application claims the benefit of Japanese Patent Application No. 2001-178295 filed on Jun. 13, 2001, which is incorporated herein by reference.

BACKGROUND OF THE INVENTION

1) Field of the Invention

The present invention relates to techniques suitable for the layout of a semiconductor integrated circuit such an integrated circuit (IC), a large-scale integration (LSI), etc., and more particularly a method and apparatus for automatically synthesizing and designing, in a design objective circuit, a clock distributing circuit (clock tree) which connects a clock-signal supplying element and clock-signal receiving elements together, and a computer readable storage medium storing a design program.

2) Description of the Related Art

Generally, in a semiconductor integrated circuit, a clock signal is supplied from at least one clock-signal supplying element (hereinafter referred to as a clock-supplying element) to a great number of clock-signal receiving elements such as flip-flops (hereinafter referred to as clock-receiving elements) through a clock distributing circuit. In such a semiconductor integrated circuit, there is an increasing demand for a higher-speed and larger-scale integrated circuit, and finning of circuit structure has advanced. Because of this, in order to make the best use of the performance of a semiconductor integrated circuit, it has been demanded to design a clock distributing circuit so that the clock skew and clock propagation delay time are optimized.

The clock propagation delay time used herein is the time needed for a clock signal to arrive from a single clock-supplying element at each clock-receiving element. Optimization of the clock propagation delay time is to reduce (or shorten) the delay time to the minimum. Also, the clock skew used herein is the difference between the timing at which a clock signal reaches one clock-receiving element (aforementioned clock propagation delay time) and the timing at which the same clock signal reaches another clock-receiving element (aforementioned clock propagation delay time). Optimization of the clock skew is to make the clock skew zero (in certain cases, to make it a desired value, not zero).

A conventional design method (method of optimizing clock skew and clock propagation delay time) for the semiconductor integrated circuit (clock distributing circuit) mentioned above is disclosed, for example, in Japanese Laid-Open Patent Publication Nos. HEI 2-62675, HEI 8-44776, and HEI 8-50604.

In the method of laying out logical circuit elements, disclosed in the aforementioned Japanese Laid-Open Patent Publication No. HEI 2-62675, logical circuit elements (clock-receiving elements) such as flip-flops are first laid out according to the connection relationship between them. Then, the number of clock amplifiers (drives) is determined and they are laid out. In this manner, the clock propagation delay time between the logical circuit elements is optimized.

In the method of designing a clock distributing circuit for a semiconductor integrated circuit, disclosed in the aforementioned Japanese Laid-Open Patent Publication No. HEI 8-44776, a clock tree is designed so that the occurrence of clock skew is suppressed. At the time of a logical design, each circuit element (clock-receiving element) is connected directly to a clock input buffer (clock-supplying element), and at the time of layout, clock buffers (drivers) corresponding to the number of circuit elements are laid out in tree form. Thereafter, wiring is performed between the clock buffers and the logical elements.

In the layout method of preventing clock skew, disclosed in the aforementioned Japanese Laid-Open Patent Publication No. HEI 8-50604, the occurrence of clock skew is prevented by making a fluctuation in the clock wiring length as small as possible. In this method, a plurality of clock-signal input terminals (clock-receiving elements) are divided into groups, and buffer cells (drivers) are inserted and laid out for each group. Thereafter, wiring is performed between the clock-signal output terminal, the buffer cells, and the clock-signal input terminals.

In the conventional methods mentioned above, basically, the number of buffers (drivers) and the number of stages are determined between a clock-supplying element and clock-receiving elements; then, net wiring is performed between the clock-supplying element, the clock-receiving elements, and the buffers; and the clock skew is adjusted (or optimized) by adjusting the state of the wiring (wiring length, wiring width, wiring shape, positions of branch points, etc.). However, to optimize the clock skew more reliably, it is preferable not to determine the number of buffers and the number of stages before the layout but rather to adjust the wired state and the positions of buffers at the time of the layout. Therefore, the development of such an optimization technique has been demanded.

Generally, to optimize clock propagation delay time, it is also desirable to generate a clock tree while taking the balance of the clock tree into consideration from the viewpoint of the density of clock-receiving elements laid out at predetermined positions. However, net wiring is often performed from a single clock-supplying element toward a great number of clock-receiving elements, and in such a method, it is possible to optimize clock skew, but it is extremely difficult to optimize clock propagation delay time at the same time.

SUMMARY OF THE INVENTION

The present invention has been made in view of the problems mentioned above. Accordingly, it is the object of the present invention to simultaneously and reliably optimize the clock propagation delay time and clock skew of the entire semiconductor integrate circuit, by determining a wiring path while adjusting both a wired state and layout of buffers from clock-receiving elements toward a clock-supplying element at the time of the layout, and then designing a clock distributing circuit.

To achieve this end, there is provided a method of designing a clock distributing circuit which distributes and supplies a clock signal from at least one clock-supplying element to a plurality of clock-receiving elements, comprising:

a temporary wiring step of temporarily wiring a signal line which directly connects the clock-supplying element with each of the clock-receiving elements disposed at predetermined positions, through the shortest path;

a judgement step of judging whether or not clock skew in the plurality of clock-receiving elements has been optimized by the signal line temporarily wired in the temporary wiring step;

a grouping step of dividing the plurality of clock-receiving elements into a plurality of groups when it is judged in the judgement step that the clock skew has not been optimized;

a buffer insertion step of (a) assigning a single buffer to each of the groups obtained by the grouping step, (b) selecting a plurality of buffer-insertion candidate positions where the buffer can be inserted and disposed, (c) temporarily wiring, for each of the selected buffer-insertion candidate positions, both a signal line which connects the buffer, disposed at the buffer-insertion candidate position, with each of the clock-receiving elements belonging to the group through the shortest path, and a signal line which connects the buffer, disposed at the buffer-insertion candidate position, with the clock-supplying element through the shortest path, (d) selecting a buffer-insertion candidate position, which can optimize clock skew and clock propagation delay time in the clock-receiving elements belonging to the group, from among the plurality of buffer-insertion candidate positions, based on temporary wiring results obtained for all of the plurality of buffer-insertion candidate positions, and (e) inserting and disposing the buffer at the selected candidate position; and a final wiring step of determining wiring paths of signal lines which connect the clock-supplying element, the plurality of clock-receiving elements, and the buffer, according to the temporary wiring results obtained in the temporary wiring step and the buffer insertion step;

wherein the temporary wiring step, the judgement step, the grouping step, and the buffer insertion step are repeatedly executed, while the buffers inserted into the plurality of groups by the buffer insertion step are being regarded as the plurality of clock-receiving elements, until it is judged in the judgement step that the clock skew has been optimized;

and wherein the final wiring step is executed when it is judged in the judgement step that the clock skew has been optimized.

In the buffer insertion step, a buffer, which has a characteristic of being able to optimize the clock propagation time from the buffer to the clock-receiving elements belonging to the group, may be selected as the buffer that is inserted into the group.

In addition, in accordance with the present invention, there is provided an apparatus for designing a clock distributing circuit which distributes and supplies a clock signal from at least one clock-supplying element to a plurality of clock-receiving elements. The design apparatus is equipped with a temporary wiring section, a judgement section, a grouping section, a buffer insertion section, and a final wiring section, which are used to execute the above-mentioned temporary wiring step, judgement step, grouping step, buffer insertion step, and final wiring step. The temporary wiring section, the judgement section, the grouping section, and the buffer insertion section are repeatedly operated, while the buffers inserted into the plurality of groups by the buffer insertion section are being regarded as the plurality of clock-receiving elements, until it is judged by the judgement section that the clock skew has been optimized. If it is judged by the judgement section that the clock skew has been optimized, the final wiring section is operated.

Furthermore, in accordance with the present invention, there is provided a computer readable storage medium storing a design program which causes a computer to design a clock distributing circuit which distributes and supplies a clock signal from at least one clock-supplying element to a plurality of clock-receiving elements. The design program causes the computer to function as the above-mentioned temporary wiring section, judgement section, grouping section, buffer insertion section, and final wiring section. The computer repeatedly functions as the temporary wiring section, the judgement section, the grouping section, and the buffer insertion section, while the buffers inserted into the plurality of groups by the buffer insertion section are being regarded as the plurality of clock-receiving elements, until it is judged by the judgement section that the clock skew has been optimized. If it is judged by the judgement section that the clock skew has been optimized, the computer functions as the final wiring section.

The design method and apparatus and the computer readable storage medium of the present invention have the following advantages:

(1) A clock-supplying element and a plurality of clock-receiving elements are first disposed and then a wiring path is determined from the clock-receiving elements toward the clock-supplying element, while both a wired state and a buffer-inserting position are being adjusted. Therefore, the clock propagation delay time and clock skew of the entire circuit are simultaneously and reliably optimized. As a result, a semiconductor circuit capable of high-speed operation can be designed and realized.

(2) A buffer having a characteristic of being able to optimize the clock propagation time from the buffer to the clock-receiving elements belonging to each group is selected as the buffer that is inserted into the group. As a result, the clock propagation delay time and clock skew of the entire circuit can be more reliably optimized.

(3) Even in the case where a specific element with a specific function (such as a selector, an inverter, etc.) is present between the clock-supplying element and some of the clock-receiving elements (specific clock-receiving elements), the position of the specific element with respect to specific clock-receiving elements, along with the wiring path between the specific element and the specific clock-receiving elements, is determined while adjusting both a wired state and a buffer-inserting position. As a result, the clock propagation delay time and clock skew of the entire circuit are simultaneously and reliably optimized.

(4) Even in the case where a plurality of clock-receiving elements belong to different logical hierarchies, a virtual input terminal which is connected to hierarchical clock-receiving elements belonging to each logical hierarchy is set for each logical hierarchy. The position of the input terminal with respect to the hierarchical clock-receiving elements, along with the wiring path between the input terminal and the hierarchical clock-receiving elements, is determined while adjusting both a wired state and a buffer-inserting position. As a result, the clock propagation delay time and clock skew of the entire circuit are simultaneously and reliably optimized.

(5) Based on the result of the final wiring, the clock-supplying element is changed to an element having a characteristic of being able to optimize clock propagation time. As a result, the clock propagation delay time and clock skew of the entire circuit can be more reliably optimized.

BRIEF DESCRIPTION OF THE DRAWINGS

The present invention will be described in further detail with reference to the accompanying drawings wherein.

DESCRIPTION OF THE PREFERRED EMBODIMENTS

Embodiments of the present invention will hereinafter be described in detail with reference to the drawings.

[1] First Embodiment

Figure 1:
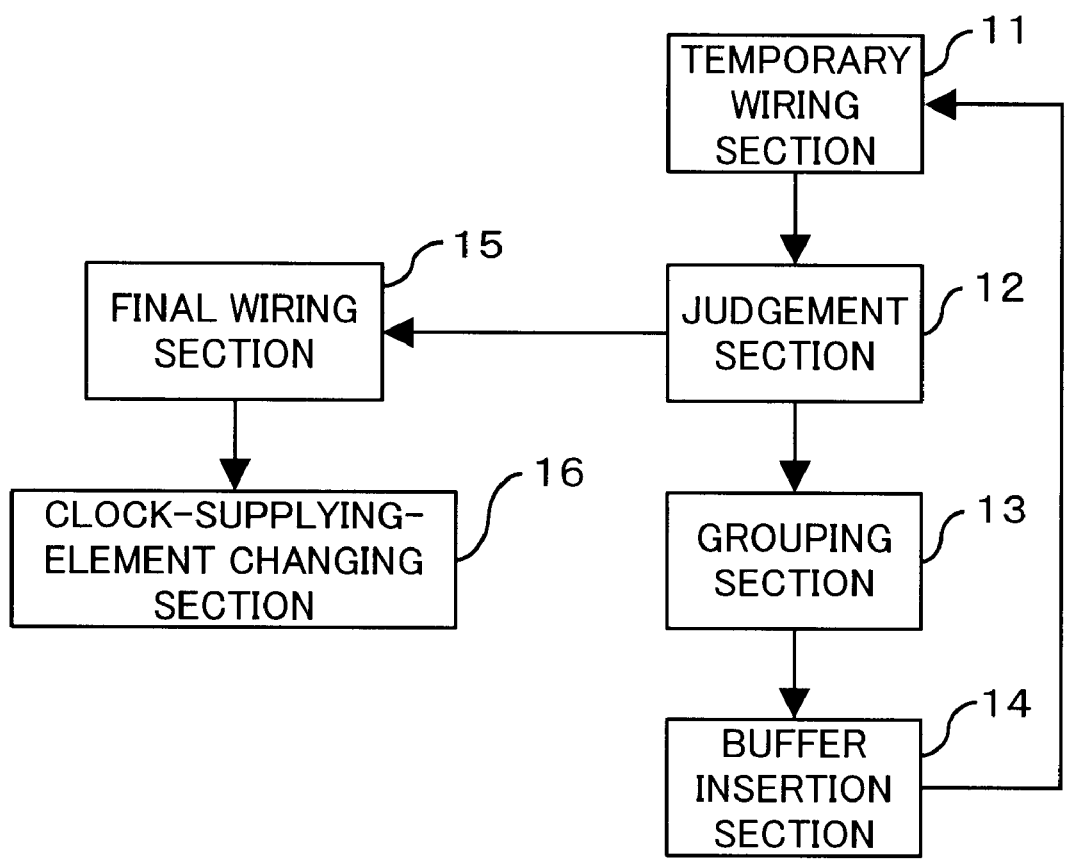
FIG. 1 is a block diagram of an apparatus for designing a clock distributing circuit, constructed according to a first embodiment of the present invention.

FIG. 1 shows an apparatus for designing a clock distributing circuit, constructed according to a first embodiment of the present invention.

The design apparatus in the first embodiment is used to design a clock distributing circuit for distributing and supplying a clock signal from at least one clock-signal supplying element (hereinafter referred to as a clock-supplying element) to a great number of clock-signal receiving elements such as flip-flops (hereinafter referred to as clock-receiving elements), based on a net list obtained by a logical design. The net list in the first embodiment includes information about clock-supplying elements and clock-receiving elements which should be disposed on a chip to be designed, but does not include information about buffers (drivers) that are interposed between the clock-supplying element and the clock-receiving elements.

The design apparatus of the first embodiment is equipped with a temporary wiring section 11, a judgement section 12, a grouping section 13, a buffer insertion section 14, a final wiring section 15, and a clock-supplying-element changing section 16, as shown in FIG. 1.

The temporary wiring section (first temporary wiring section) 11 temporarily wires a signal line (net) which connects a clock-supplying element directly with each of all clock-receiving elements disposed at predetermined positions on the chip, through the shortest path. That is, the temporary wiring section 11 temporarily wires the shortest signal line which directly supplies a clock signal (net) from the clock-supplying element to each of all the clock-receiving elements so that the clock propagation delay time can be optimized.

The judgement section (first judgement section) 12 judges whether or not the clock skew in a plurality of clock-receiving elements has been optimized by the signal line temporarily wired by the temporary wiring section 11.

The grouping section (first grouping section) 13 divides a plurality of clock-receiving elements into a plurality of groups when it is judged by the judgement section 12 that the clock skew has not been optimized.

The buffer insertion section (first buffer insertion section) 14 selects a buffer which is inserted between the clock-supplying element, and the clock-receiving elements belonging to each group obtained by the grouping section 13. The buffer is selected so that clock propagation delay time and clock skew become optimum. The buffer insertion section 14 also determines a position where the buffer is disposed, and performs temporary wiring from the selected buffer to the clock-receiving elements selected by the grouping section 13.

More specifically, the buffer insertion section 14 has the following functions:

the function (1) of assigning a single buffer to each of the groups obtained by the grouping section 13;

the function (2) of selecting, on a chip, a plurality of buffer-insertion candidate positions where the buffer assigned by the function (1) can be inserted and disposed;

the function (3) of temporarily wiring, for each buffer-insertion candidate position selected by the function (2), a signal line (net) which connects the buffer, disposed at the buffer-insertion candidate position, with the clock-receiving elements belonging to the group through the shortest path, and also temporarily wiring a signal line which connects the buffer, disposed at the buffer-insertion candidate position, with each of the clock-supplying element through the shortest path;

the function (4) of selecting a buffer-insertion candidate position, which can optimize the clock skew and clock propagation delay time in the clock-receiving elements belonging to the group, from among a plurality of buffer-insertion candidate positions, based on the temporary wiring results obtained for all the buffer-insertion candidate positions by the function (3);

the function (5) of inserting and disposing the assigned buffer at the candidate position selected by the function (4); and the function (6) of selecting, as the buffer that is inserted into each group, a buffer which has a characteristic of being able to optimize the clock propagation delay time from the buffer to the clock-receiving elements belonging to the group.

The final wiring section 15 determines wiring paths of signal lines (net, clock tree) connecting a clock-supplying element and a plurality of clock-receiving elements together, according to the temporary wiring results obtained by the temporary wiring section 11 and the buffer insertion section 14, when it is judged by the judgement section 12 that the clock skew has been optimized.

The clock-supplying-element changing section 16 changes the clock-supplying element to an element having a characteristic of being able to optimize clock propagation delay time, based on the result of wiring obtained by the final wiring section 15. However, when clock propagation delay time is optimized by a clock-supplying element in the net list, the clock-supplying-element changing section 16 is not operated.

Note that there are generally a great number of clock-supplying elements that have the same function (clock-signal supplying function) but are different in characteristic such as output-driving ability, etc. In cases where elements differ in characteristic, the clock-signal propagation times for the different elements also differ from each other. There is usually a tendency that an element with a greater output-driving ability has a smaller signal propagation time. Hence, in the first embodiment, the clock-supplying element determined in the net list is changed to an element which has the same function as the clock-supplying element but has a characteristic of being able to optimize clock propagation delay time.

Next, in the design apparatus of the first embodiment, the temporary wiring section 11, judgement section 12, grouping section 13, and buffer insertion section 14 operate repeatedly, while the buffers inserted into a plurality of groups by the buffer insertion section 14 are being regarded as a plurality of clock-receiving elements, until it is judged by the judgement section 12 that clock skew has been optimized. Thereafter, the final wiring section 15 and the clock-supplying element changing section 16 operate.

The above-mentioned temporary wiring section 11, judgement section 12, grouping section 13, buffer insertion section 14, final wiring section 15, and clock-supplying element changing section 16 are realized by dedicated software (design program for the clock distributing circuit).

This design program is provided, for example, in a form of being recorded on a computer readable storage medium such as a flexible disk, a CD-ROM, etc. In the first embodiment, a design program is previously stored in a read-only memory (not shown), etc. which form part of the design apparatus, and this design program is read out and executed by a central processing unit (not shown) that also forms part of the design apparatus. In this manner, the functions of the above-mentioned temporary wiring section 11, judgement section 12, grouping section 13, and buffer insertion section 14, final wiring section 15, and clock-supplying element changing section 16 are realized.

More specifically, the design program causes the CPU to repeatedly function as the temporary wiring section 11, judgement section 12, grouping section 13, and buffer insertion section 14, while the buffers inserted into a plurality of groups by the buffer insertion section 14 are being regarded as a plurality of clock-receiving elements, until it is judged by the judgement section 12 that clock skew has been optimized. Thereafter, the design program causes the CPU to function as the final wiring section 15 and the clock-supplying element changing section 16.

Note that the design program may be recorded on a storage unit (storage medium), such as a magnetic disk, an optical disk, a magneto-optic disk, etc., so that it can be provided from the storage unit to the CPU through a communication path.

Figure 2:
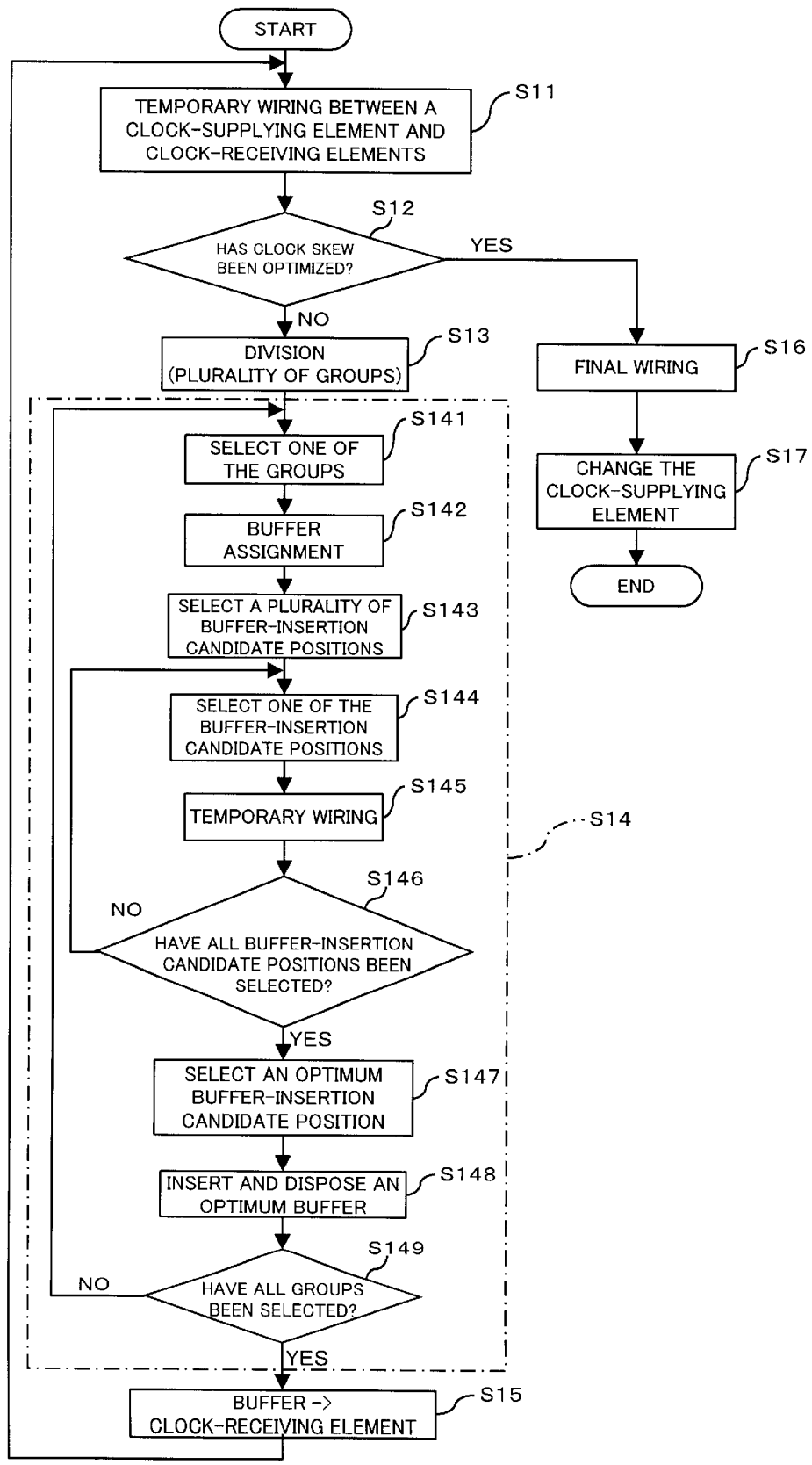
FIG. 2 is a flowchart used to explain the design method of the first embodiment of the present invention.

Next, operation of the design apparatus of the first embodiment mentioned above, that is, a design method for a clock distributing circuit as the first embodiment of the present invention will be described according to a flowchart (steps S11 to S17) shown in FIG. 2.

In the design apparatus of the first embodiment, if a net list is obtained as a result of a logical design, information about a clock distributing circuit, that is, information about a clock-supplying element and a plurality of clock-receiving elements, is extracted, and signal lines are temporarily wired by the temporary wiring section 11 so that the clock-supplying element and each of the clock-receiving elements are connected together through the shortest path (step S11: first temporary wiring step).

It is judged by the judgement section 12 whether or not the clock skew in the clock-receiving elements has been optimized by the temporarily wired signal line (step S12: first judgement step). If it is judged that the clock skew has not been optimized ("NO" route in step S12), the clock-receiving elements are divided into a plurality of groups by the grouping section 13 (step S13: first grouping step). The number of clock-receiving elements that are included in each group is determined, for example, according to the characteristic (output-driving ability, etc.) of a buffer that is inserted. In addition, a predetermined number of clock-receiving elements close to one another are basically collected into a single group.

Thereafter, in each group divided in step S13, a buffer is inserted and disposed (step S14: first buffer insertion step). In this step S14, the following steps S141 to S149 are performed by the buffer insertion section 14.

One of the groups divided in step S13 is first selected (step S141), and a single buffer is assigned to the selected group (step S142). Then, a region where the buffer can be disposed is recognized, and within the region, a plurality of buffer-insertion candidate positions are selected (step S143).

Furthermore, one of the buffer-insertion candidate positions selected in step S143 is selected (step S144). A signal line is temporarily wired so that the buffer disposed at the selected buffer-insertion candidate position is connected with each of the clock-receiving elements belonging to the group selected in step S141, through the shortest path. Also, a signal line is temporarily wired so that the buffer disposed at the selected buffer-insertion candidate position is connected with the clock-supplying element through the shortest path. The delay time due to these signal lines is calculated. The delay time obtained here is held as a solution in memory etc., along with information about the buffer-insertion candidate position and the wiring path (step S145).

The above-mentioned steps S144 and S145 are executed for all the buffer-insertion candidate positions selected in step S143. That is, in step S146, steps S144 and S145 are repeatedly executed until it is judged that execution of steps S144 and S145 has ended for all the buffer-insertion candidate positions.

If it is judged that execution of steps S144 and S145 has ended for all the buffer-insertion candidate positions ("YES" route in step S146), a buffer-insertion candidate position which can optimize the clock skew and clock propagation delay time in the clock-receiving elements belonging to the selected group is selected from among a plurality of buffer-insertion candidate positions, based on the delay times obtained for all the buffer-insertion candidate positions (step S147).

Thereafter, a buffer is inserted and disposed at the candidate position selected in step S147 (step S148). The buffer that is inserted is selected based on the temporary wiring result obtained in step S145. That is, the buffer has a characteristic of being able to optimize the clock propagation delay time from the buffer to the clock-receiving elements belonging to the group into which the buffer is inserted.

The above-mentioned steps S141 to S148 are executed on all the groups divided in step S13. That is, in step S149, steps S141 to S148 are repeatedly executed until it is judged that execution of steps S141 to S148 has ended for all the groups.

If it is judged that execution of steps S141 to S148 has ended for all the groups ("YES" route in step S149), the buffers inserted into the groups by the buffer insertion section 14 are regarded as clock-receiving elements (step S15), and the process returns to step S11. The above-mentioned steps S11 to S15 are repeatedly executed until it is judged in step S12 that the clock skew has been optimized.

If it is judged in step S12 that the clock skew has been optimized ("YES" route), the final wiring section 15 determines the wiring paths of the signal lines connecting the clock-supplying element and the clock-receiving elements/ buffers together, based on the temporary wiring results obtained in steps S11 and S145 (step S16: final wiring step).

Furthermore, in the clock-supplying-element changing section 16, the clock-supplying element specified in the net list is changed to an element having a characteristic of being able to optimize clock propagation time, based on the wiring result obtained in step S16 (step S17: clock-supplying-element changing step). However, when clock propagation delay time is optimized by the clock-supplying element specified in the net list, as previously described, the clock-supplying-element changing step is not executed by the clock-supplying-element changing section 16.

Next, the design operation of the first embodiment will be described in further detail with respect to FIGS. 3 to 9. Note in the figures that a triangular mark given reference character CLK denotes a clock-supplying element and that 8 (eight) rectangular marks given reference characters A to H denote clock-receiving elements. Also, a shaded portion in each of the clock-receiving elements A to H indicates the position of a clock-input terminal.

Figure 3:
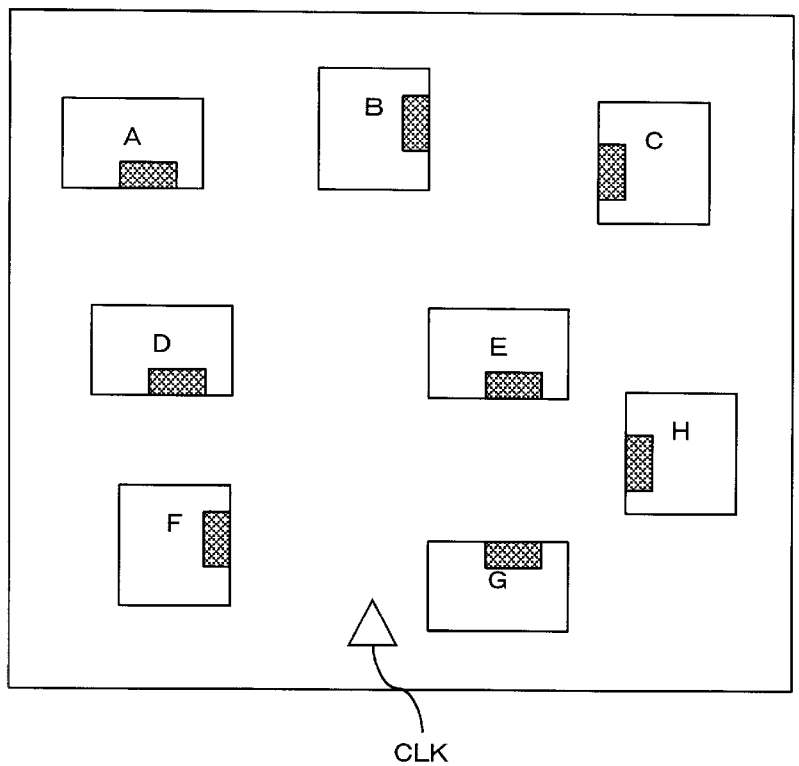
FIGS. 3 to 9 are diagrams used to explain a specific design operation of the first embodiment.

The positions of the clock-supplying element CLK and the clock-receiving elements A to H are given by the net list, and a circuit such as that shown in FIG. 3 is input to the design apparatus of the first embodiment. In the circuit, the clock-supplying element CLK and the clock-receiving elements A to H are disposed at predetermined positions on the chip.

With respect to an input circuit such as the one shown in FIG. 3, a signal line (see a two-dotted line in FIG. 4) is temporarily wired by the temporary wiring section 11 so that the clock-supplying element CLK is connected with the clock-receiving elements A to H through the shortest path (step S11). The result of the temporary wiring is shown in FIG. 4.

Figure 4:
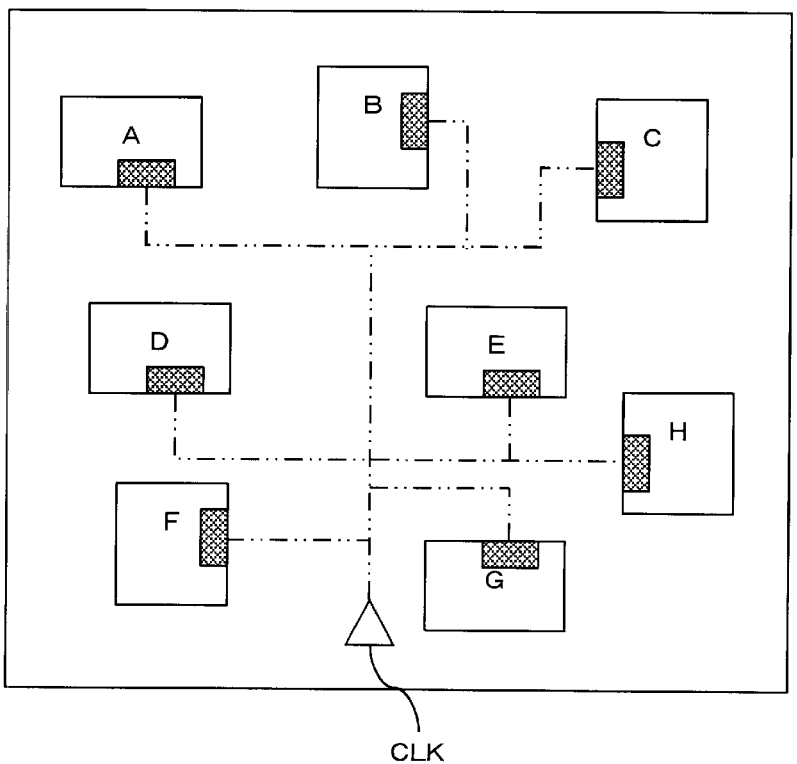

In the judgement section 12, whether or not the clock skew in the clock-receiving elements A to H has been optimized is judged based on the result of the temporary wiring shown in FIG. 4 (step S12).

Figure 5:
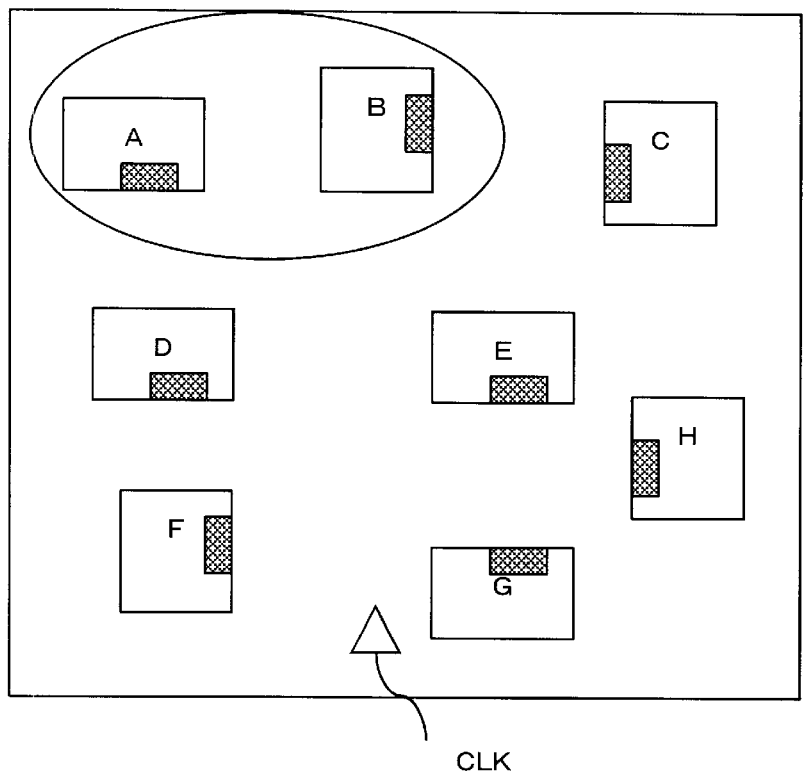

When it is judged in the judgement section 12 that the clock skew has not been optimized, a group of clock-receiving elements into which a buffer is inserted is selected by the grouping section 13 (step S13). The selected group is shown in FIG. 5. In the example shown in FIG. 5, two clock-receiving elements A and B belong to the single group.

Figure 6:
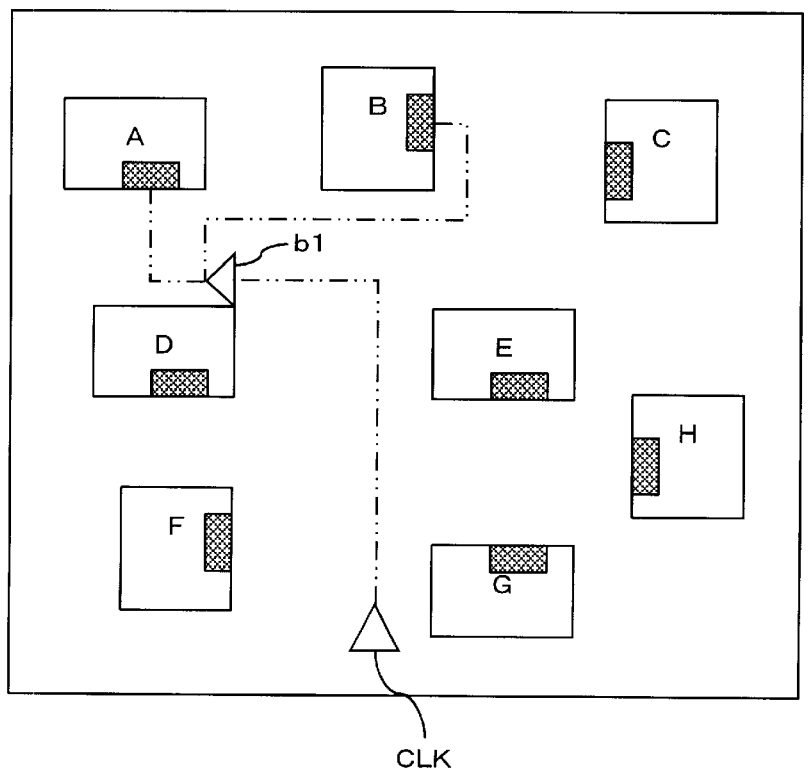
Figure 7:
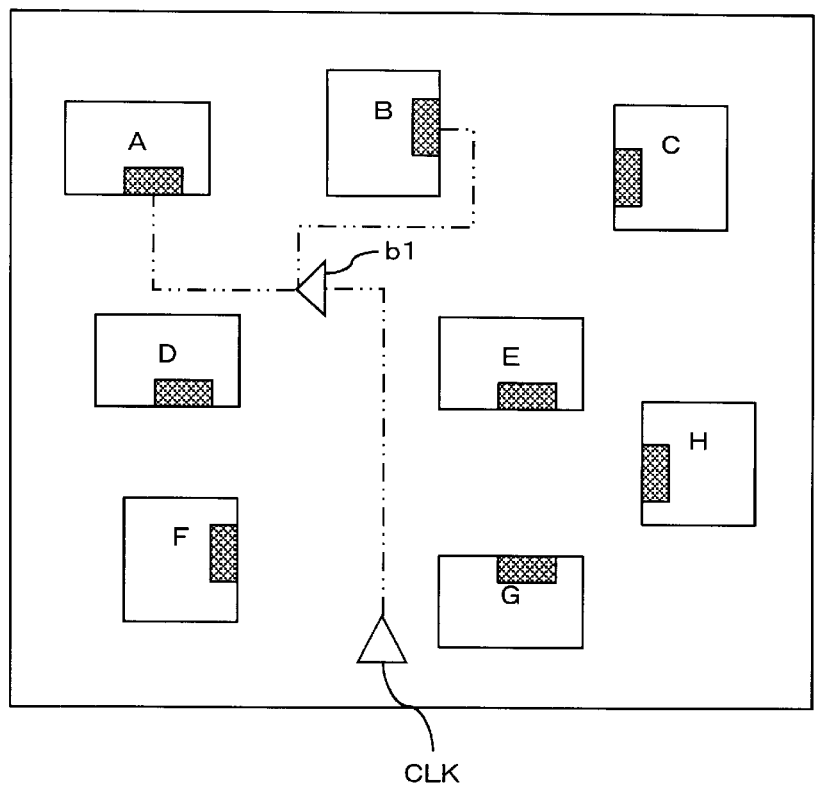
Figure 8:
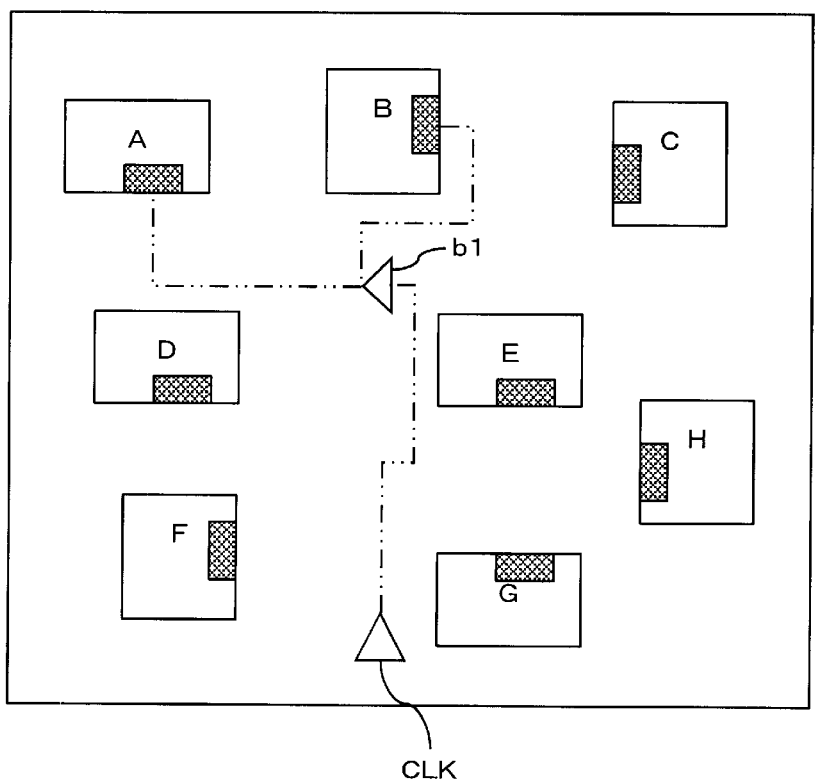

Next, in the buffer insertion section 14, as shown in FIGS. 6 to 8, three buffer-insertion candidate positions, for example, are selected between the clock-supplying element CLK and the clock-receiving elements A, B (step S143).

Assume that buffers b1 are disposed at the buffer-insertion candidate positions, respectively. A signal line connecting the buffer b1 and each of the clock-receiving elements A, B through the shortest path, and a signal line connecting the buffer b1 and the clock-supplying element CLK through the shortest path, are temporarily wired and the delay time due to these signal lines (see two-dotted lines shown in FIGS. 6 to 8) is calculated. The calculated delay time is held as a solution in memory, etc., along with information about the buffer-insertion candidate position and the wiring path (steps S144 to S146).

After the aforementioned steps have been performed for all the buffer-insertion candidate positions, a buffer-insertion candidate position which can the optimize clock propagation time and clock skew is selected from among a plurality of buffer-insertion candidate positions, based on the above-mentioned solutions being stored. The buffer b1 to be inserted, the buffer-inserting position, and the wiring paths are determined, and the buffer b1 is inserted and disposed at the determined position (steps S147 and S148). In this example, assume that the buffer-insertion candidate position shown in FIG. 7 is selected and determined as the position where the buffer b1 is inserted and disposed.

Figure 9:
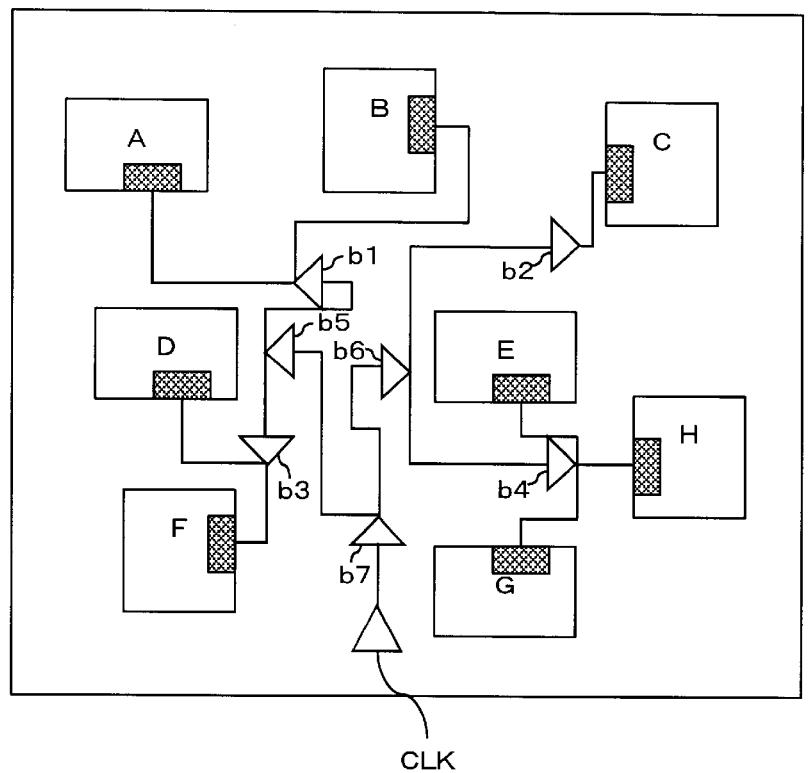

FIG. 9 shows a specific example of a clock tree finally generated from the circuit shown in FIG. 3 by the above-mentioned steps. The buffer-inserting positions and the wiring path shown in FIG. 9 are obtained in the following manner.

With respect to a group to which the clock-receiving element C belongs, a group to which the clock-receiving elements D, F belong, and a group to which the clock-receiving elements E, G, H belong, the above-mentioned steps (steps S142 to S148) are executed. As a result, positions where the buffers b2, b3, b4 are disposed are determined along with the buffer characteristics and the wiring paths.

Subsequently, the buffers b1 to b4 are regarded as clock-receiving elements (step S15), the above-mentioned steps (steps S11 to S14) are executed. That is, for a group to which the buffers b1, b2 belong and a group to which the buffers b2, b4 belong, the above-mentioned steps S142 to S148 are executed and positions where buffers b5, b6 are inserted are determined.

Furthermore, the buffers b5, b6 are regarded as clock-receiving elements (step S15) and the above-mentioned steps S11 to S14 are executed. That is, for a group to which the buffer b5 belongs and a group to which the buffer b6 belongs, the above-mentioned steps S142 to S148 are executed and a position where a buffer b7 is inserted is determined.

The buffer b7 is regarded as a clock-receiving element (step S15) and it is judged that clock skew has been optimized by the shortest signal line, temporarily wired between the buffer b7 and the clock-supplying element CLK. In addition to the wiring paths of signal lines between the clock-supplying element CLK, buffers b1 to b7, and clock-receiving elements A to H, the characteristic of the clock-supplying element CLK, etc., are determined. Finally, a clock tree (clock distributing circuit) such as that shown in FIG. 9 is generated.

Thus, according to the first embodiment of the present invention, a clock-supplying element and a plurality of clock-receiving elements are first disposed and then a wiring path is determined from the clock-receiving elements toward the clock-supplying element, while both a wired state and a buffer-inserting position are being adjusted. Therefore, the clock propagation delay time and clock skew of the entire circuit are simultaneously and reliably optimized. As a result, a semiconductor circuit capable of high-speed operation can be designed and realized.

In addition, in the first embodiment, in the buffer insertion section 14 a buffer having a characteristic of being able to optimize the clock propagation time from the buffer to the clock-receiving elements belonging to each group is selected as the buffer that is inserted into the group, and based on the result of final wiring, in the clock-supplying-element changing section 16 the clock-supplying element is changed to an element having a characteristic of being able to optimize clock propagation delay time. As a result, the clock propagation delay time and clock skew of the entire circuit can be more reliably optimized.

[1-1] First Modification of the First Embodiment

Figure 10:
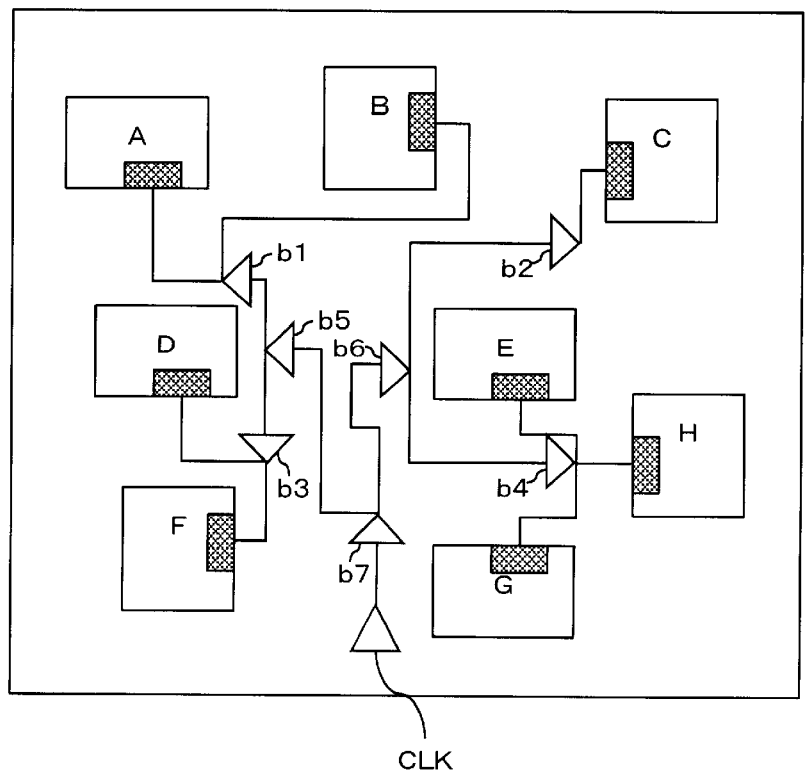
FIG. 10 is a diagram used to explain a specific design operation of a first modification of the first embodiment.

FIG. 10 shows a specific design operation of a first modification of the first embodiment.

In the first embodiment described above, the optimizing condition for clock skew is that clock skew is made zero at each clock-receiving element. However, the present invention is not limited to this condition. As in the first modification of the first embodiment, different clock-skew restricting conditions may be given to clock-receiving elements, respectively. In this case, the judgement section 12 and the buffer insertion section 14 judge whether or not clock skew has been optimized, based on the clock-skew restricting conditions, input when the design of a clock distributing circuit is started (see steps S12 and S147 in FIG. 2). Therefore, buffers to be inserted, buffer-inserting positions, and wiring paths are determined so that clock skew meets given restricting conditions, and a clock tree (clock distributing circuit) is generated.

For example, the clock tree shown in FIG. 9 is generated under the optimizing condition that clock skew is made zero, whereas a clock tree (clock distributing circuit) shown in FIG. 10 has clock skew between clock-receiving elements A and B. In the example shown in FIG. 10, the clock-skew optimizing condition for clock-receiving elements B to H is that clock skew is zero, while the restricting condition for clock-receiving elements A and B is that a clock signal propagates to the clock-receiving element A faster than to the clock-receiving element B by a predetermined time. Under these conditions, the clock tree shown in FIG. 10 is generated so that it has clock skew between the clock-receiving elements A and B.

Thus, if a judgement of optimization is made according to different clock-skew restrictions given to a plurality of clocking-receiving elements, a buffer-inserting position (see the buffer b1 in FIG. 10) and a wiring path of a signal line are determined so that the restrictions are met. Therefore, a clock tree (clock distributing circuit) meeting clock-skew restrictions can be easily generated and designed.

[1-2] Second Modification of the First Embodiment

Figure 11:
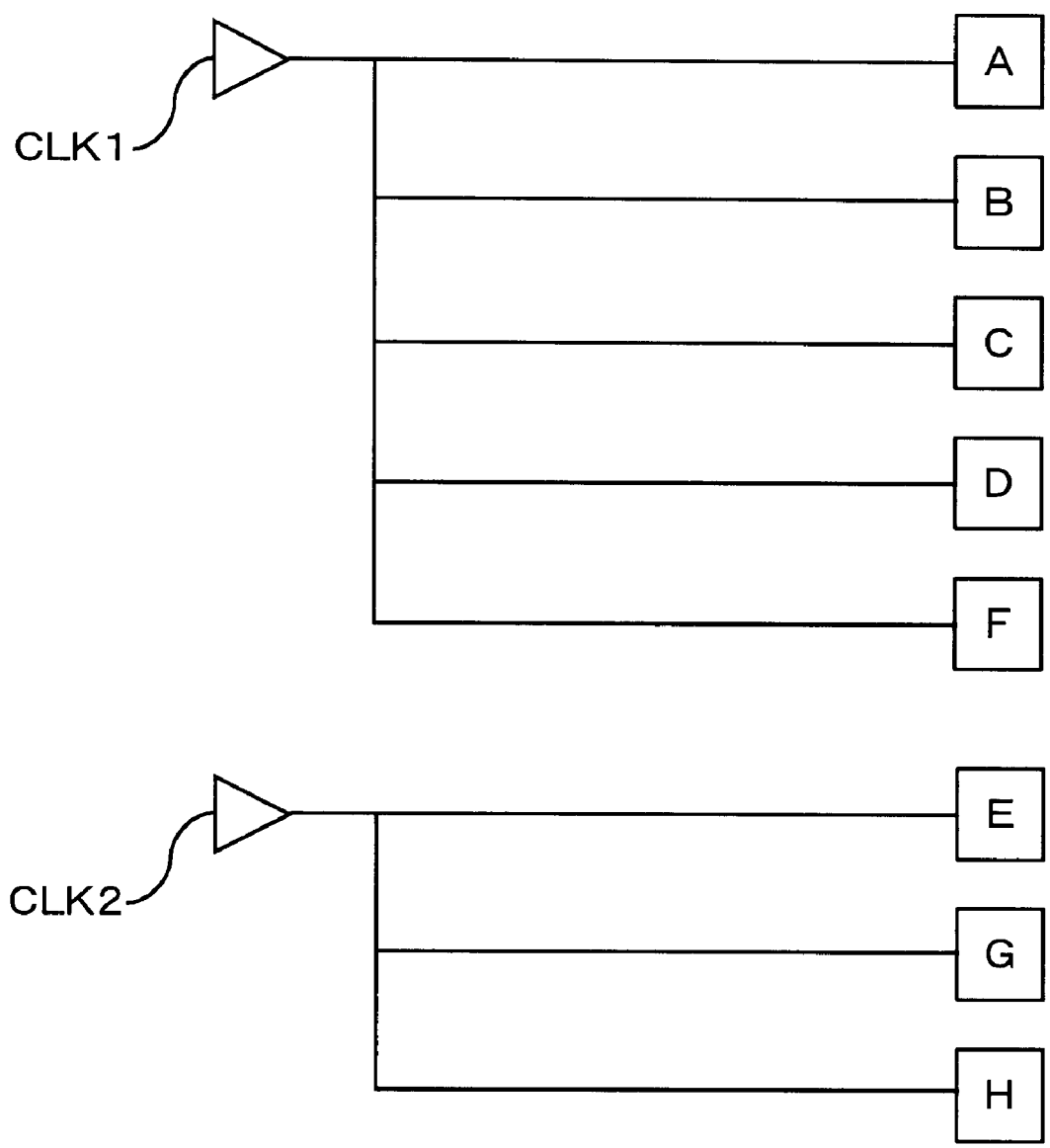
FIGS. 11 to 13 are diagrams to explain a specific design operation of a second modification of the first embodiment.
Figure 12:
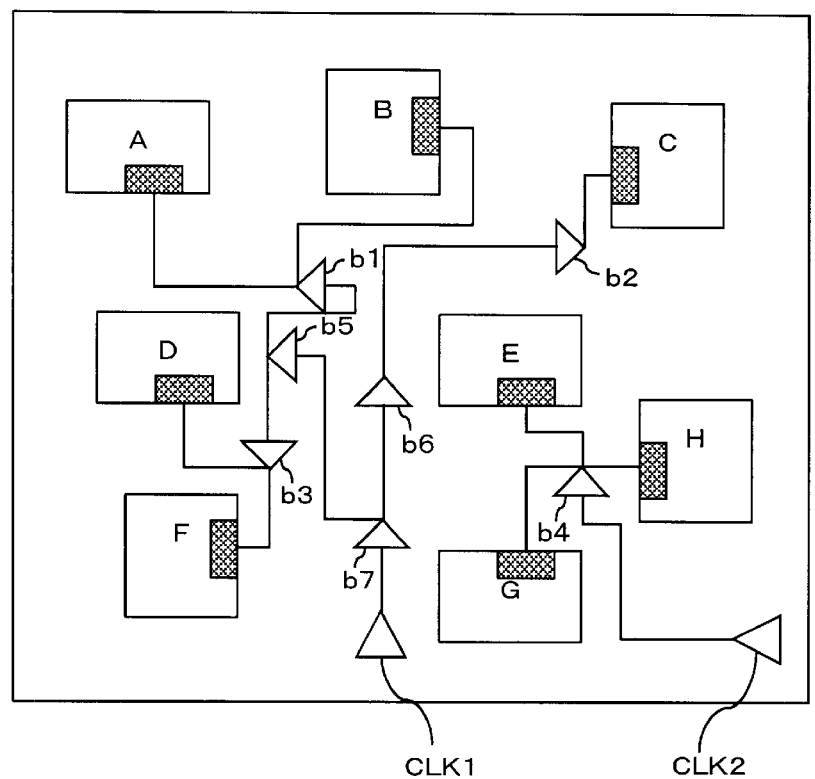
Figure 13:
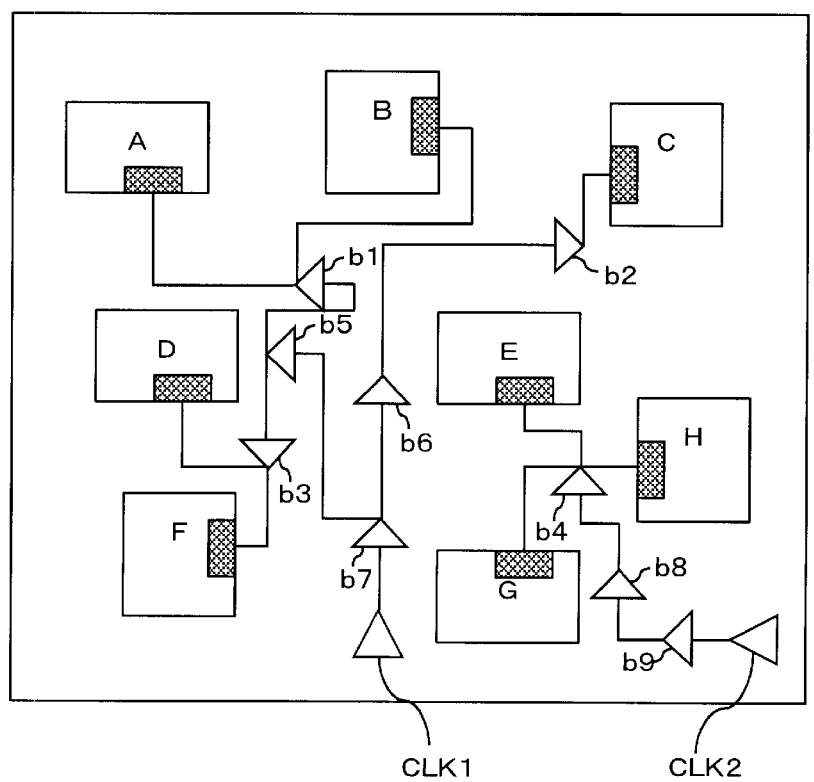

FIGS. 11 to 13 show a specific design operation of a second modification of the first embodiment.

While the above-mentioned first embodiment has been described with regard to the case of a single clock-supplying element CLK, the second modification of the first embodiment is equipped with two clock-supplying elements CLK1 and CLK2, as shown in FIG. 11. For instance, a clock signal is supplied from the clock-supplying element CLK1 to clock-receiving elements A to C, D, and F, and a clock signal is supplied from the clock-supplying element CLK2 to clock-receiving elements E, G, and H. Assume that the clock-receiving elements A to H are disposed at the same positions as those shown in FIGS. 3 to 9 and that the clock-supplying element CLK1 is disposed at the same position as the clock-supplying element CLK shown in FIGS. 3 to 9.

In the second modification, if a net list with information shown in FIG. 11 is input to the design apparatus, the same steps (see steps S11 to S17 in FIG. 2) as the first embodiment are first executed for each of the clock-supplying elements CLK1 and CLK2, based on the net list.

That is, a clock distributing circuit between the clock-supplying element CLK1 and the clock-receiving elements A to C, D, and F, disposed on the chip, is designed in the same manner as the first embodiment. As a result, the positions of buffers b1 to b3 and b5 to b7, the wiring path, etc., are determined between the clock-supplying element CLK1 and the clock-receiving elements A to C, D, and F, as shown in FIG. 12.

In addition, another clock distributing circuit between the clock-supplying element CLK2 and the clock-receiving elements E, G, and H, disposed on the chip, is designed in the same manner as the first embodiment. As a result, the position of a buffer b4, the wiring path, etc., are determined between the clock-supplying element CLK2 and the clock-receiving elements E, G, and H, as shown in FIG. 12.

As shown in FIG. 12, two clock trees (clock distributing circuits) are generated for the two clock-supplying elements CLK1, CLK2. In this case, when there is a difference in clock propagation delay time between the two clock trees, buffers corresponding to the difference in clock propagation delay time are inserted into the clock tree which is shorter in clock propagation delay time so that the clock propagation delay times of the two clock tress coincide with each other. In this manner, the buffer-inserting position and the wiring path are determined. Such a determination process is executed, for example, by the final wiring section 15.

For example, in the case where the clock propagation delay time of the clock tree for the clock-supplying element CLK2 in FIG. 12 is shorter than that of the clock tree for the clock-supplying element CLK1, buffers b8, b9 corresponding to the difference in clock propagation delay time are inserted, for example, between the clock-supplying element CLK2 and the buffer b4, and the positions of the buffers b8, b9 and the wiring path are determined.

In the case where two or more clock-supplying elements are present in a design objective circuit, as described above, a clock distributing circuit for each clock-supplying element is designed between the clock-supplying element and the clock-receiving elements to which a clock signal is supplied from the clock-supplying element, in the same manner as the first embodiment. Thereafter, the positions of buffers and the wiring paths of the signal lines are determined so that the clock propagation delay times of the clock trees coincide with each other. As a result, even in the case where a plurality of clock-supplying elements are present, the clock propagation delay time and clock skew of the entire circuit can be optimized, as with the first embodiment.

In the second modification, a circuit with two clock-supplying elements is input to the design apparatus. However, the present invention is not limited to this. Even in the case where 3 or more clock-supplying elements are present in a circuit, the clock distributing circuit can be designed in the same manner as the aforementioned case.

[2] Second Embodiment

Figure 14:
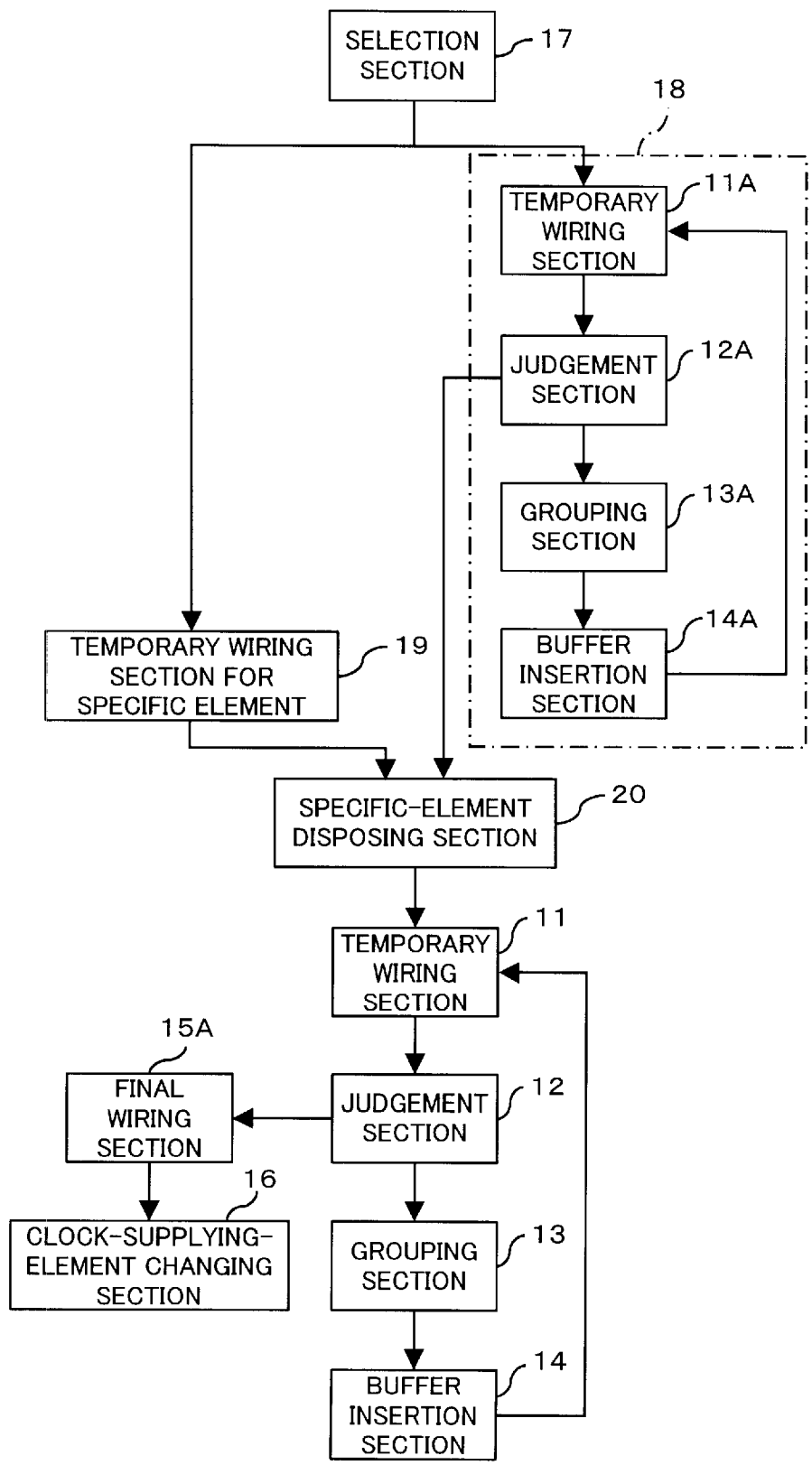
FIG. 14 is a block diagram of an apparatus for designing a clock distributing circuit, constructed according to a second embodiment of the present invention.

FIG. 14 shows an apparatus for designing a clock distributing circuit, constructed according to a second embodiment of the present invention. In the figure, the same reference numerals denote the same parts as the aforementioned embodiments or nearly the same parts. Therefore, a detailed description is omitted for avoiding redundancy.

In the second embodiment, a net list for a design objective circuit obtained by a logical design includes information about a clock-supplying element and clock-receiving elements that should be disposed on a chip to be designed, as with the first embodiment. The net list further includes information about a specific element (e.g., a selector, an inverter, etc.), disposed between a clock-supplying element and some of clock-receiving elements (hereinafter referred to as specific clock-receiving elements), which fulfills a specific function.

This specific element is present in a circuit (circuit in the stage of a logical design), as with clock-supplying elements and clock-receiving elements. However, the position of the specific element has not been determined like clock-supplying elements and clock-receiving elements. In the second embodiment, the position of the specific element, as described later, is determined at the time of the layout so that clock skew and clock propagation delay time are optimized.

The design apparatus in the second embodiment is used for designing a clock distributing circuit for distributing and supplying a clock signal from a single clock-signal supplying element to a plurality of clock-signal receiving elements through a specific element, based on the above-mentioned net list. The net list in the second embodiment does not include information about buffers, as with the net list of the first embodiment.

The design apparatus of the second embodiment is equipped with a temporary wiring section 11, a judgement section 12, a grouping section 13, a buffer insertion section 14, a final wiring section 15A, and a clock-supplying-element changing section 16, as with the first embodiment, as shown in FIG. 14. The design apparatus is further equipped with a selection section 17, a specific-element design section 18, a temporary specific-element wiring section (temporary wiring section for specific element) 19, and a specific-element disposing section 20, at the first stage before the temporary wiring section 11.

The selection section 17 selects, on the chip, a plurality of specific-element disposition candidate positions where specific elements can be disposed.

The specific-element design section 18 performs the insertion of buffers and the temporary wiring of signal lines between a specific element, disposed at each specific-element disposition candidate position selected by the selection section 17, and specific clock-receiving elements disposed at predetermined positions. For this reason, the specific-element design section 18 is equipped with a temporary wiring section 11A, a judgement section 12A, a grouping section 13A, and a buffer insertion section 14A. The temporary wiring section 11A, judgement section 12A, grouping section 13A, and buffer insertion section 14A fulfill nearly the same functions as the temporary wiring section 11, judgement section 12, grouping section 13, and buffer insertion section 14 described in the first embodiment.

More specifically, the temporary wiring section (second temporary wiring section) 11A temporarily wires a signal line which connects a specific element, disposed at each specific-element disposition candidate position, directly with each of specific clock-receiving elements disposed at predetermined positions on the chip, through the shortest path. That is, the temporary wiring section 11A temporarily wires the shortest signal line which directly supplies a clock signal from the specific element to all the specific clock-receiving elements so that the clock propagation delay time can be optimized.

The judgement section (second judgement section) 12A judges whether or not the clock skew in the specific clock-receiving elements has been optimized by the signal line temporarily wired by the temporary wiring section 11A.

The grouping section (second grouping section) 13A divides the specific clock-receiving elements into a plurality of groups when it is judged by the judgement section 12A that the clock skew has not been optimized.

The buffer insertion section (second buffer insertion section) 14A selects a buffer which is inserted between the specific element, and the specific clock-receiving elements belonging to each group obtained by the grouping section 13A. The buffer is selected so that clock propagation delay time and clock skew become optimum. The buffer insertion section 14 also determines a position where the buffer is disposed, and performs temporary wiring from the selected buffer to the specific clock-receiving elements selected by the grouping section 13A.

More specifically, the buffer insertion section 14A has functions (11) to (16) corresponding to the functions (1) to (6) of the buffer insertion section 14 described in the first embodiment as follows:

the function (11) of assigning a single buffer to each of the groups obtained by the grouping section 13A;

the function (12) of selecting, on a chip, a plurality of buffer-insertion candidate positions where the buffer assigned by the function (11) can be inserted and disposed;

the function (13) of temporarily wiring, for each buffer-insertion candidate position selected by the function (12), a signal line which connects the buffer, disposed at the buffer-insertion candidate position, with each of the specific clock-receiving elements belonging to the group through the shortest path, and also temporarily wiring a signal line which connects the buffer, disposed at the buffer-insertion candidate position, with the specific element through the shortest path;

the function (14) of selecting a buffer-insertion candidate position, which can optimize the clock skew and clock propagation delay time in the specific clock-receiving elements belonging to the group, from among a plurality of buffer-insertion candidate positions, based on the temporary wiring results obtained for all the buffer-insertion candidate positions by the function (13);

the function (15) of inserting and disposing the assigned buffer at the candidate position selected by the function (14); and the function (16) of selecting, as the buffer that is inserted into each group, a buffer which has a characteristic of being able to optimize the clock propagation delay time from the buffer to the specific clock-receiving elements belonging to the group.

In the specific-element design section 18 of the second embodiment, the temporary wiring section 11A, judgement section 12A, grouping section 13A, and buffer insertion section 14A operate repeatedly for each of the specific-element disposition candidate positions selected by the selection section 17, while the buffers inserted into a plurality of groups by the buffer insertion section 14A are being regarded as specific clock-receiving elements, until it is judged by the judgement section 12A that clock skew has been optimized.

The temporary specific-element wiring section 19 temporarily wires a signal line which connects the clock-supplying element with the specific element disposed at each specific-element disposition candidate position selected by the selection section 17 through the shortest path.

The specific-element disposing section 20 selects a specific-element disposition candidate position, which can optimize the clock skew and clock propagation delay time in specific clock-receiving elements, from among a plurality of specific-element disposition candidate positions, based on the temporary wiring results obtained for all the specific-element disposition candidate positions by the specific-element design section 18 and the temporary specific-element wiring section 19. Furthermore, the specific-element disposing section 20 disposes a specific element at the selected candidate position, and adopts the temporary wiring result and the buffer-inserting position obtained for the selected candidate position.

Next, in the design apparatus of the second embodiment, a plurality of clock-receiving elements excluding the above-mentioned specific clock-receiving elements, and the specific element disposed by the specific-element disposing section 20, are regarded as a plurality of clock-receiving elements. As with the design apparatus of the first embodiment, the temporary wiring section 11, judgement section 12, grouping section 13, and buffer insertion section 14, final wiring section 15A, and clock-supplying element changing section 16 are operated.

Note that the final wiring section 15A of the second embodiment determines the wiring paths of signal lines which connect a clock-supplying element, a plurality of clock-receiving elements, buffers, and specific elements, according to the temporary wiring result adopted by the specific-element disposing section 20, and the specific-element disposing position determined by the specific-element disposing section 20.

The above-mentioned temporary wiring section 11, judgement section 12, grouping section 13, buffer insertion section 14, final wiring section 15A, clock-supplying element changing section 16, selection section 17, specific-element design section 18, temporary specific-element wiring section 19, and specific-element disposing section 20 are realized by dedicated software (design program for the clock distributing circuit), as with the first embodiment.

This design program, as with the first embodiment, is provided, for example, in a form of being recorded on a computer readable storage medium such as a flexible disk, a CD-ROM, etc. As with the first embodiment, a design program is previously stored in a read-only memory (not shown), etc. which form part of the design apparatus, and this design program is read out and executed by a central processing unit (not shown) that also forms part of the design apparatus. In this manner, the functions of the above-mentioned temporary wiring section 11, judgement section 12, grouping section 13, and buffer insertion section 14, final wiring section 15A, clock-supplying element changing section 16, selection section 17, specific-element design section 18, temporary specific-element wiring section 19, and specific-element disposing section 20 are realized.

Note that the second embodiment may be constructed so that the temporary wiring section 11 also functions as the temporary specific-element wiring section 19 and the temporary wiring section 11A and that the judgement section 12, the grouping section 13 and the buffer insertion section 14 also function as the judgement section 12A, the grouping section 13A, and the buffer insertion section 14A.

Figure 15:
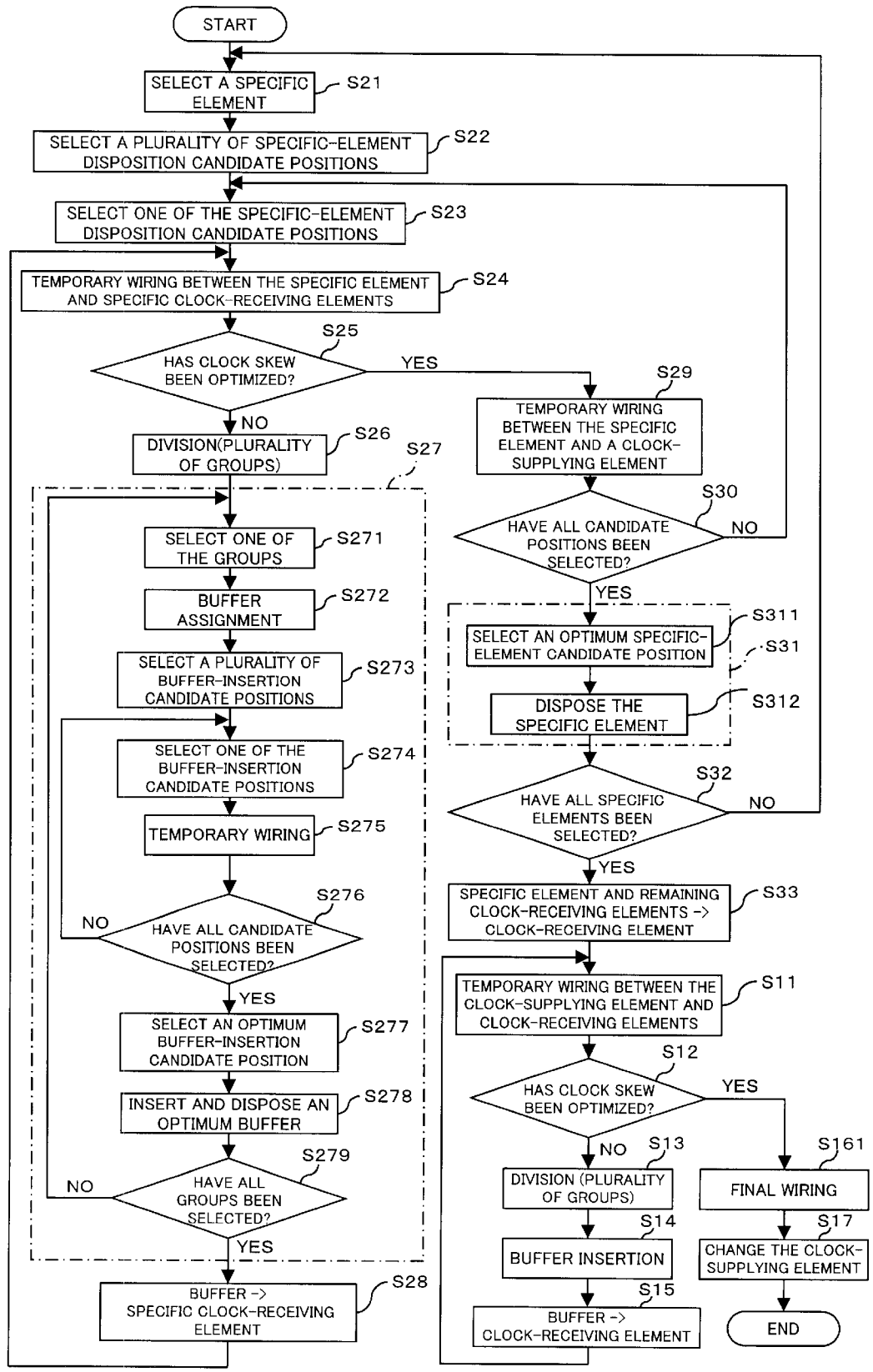
FIG. 15 is a flowchart used to explain the design method of the second embodiment of the present invention.

Next, operation of the design apparatus of the second embodiment mentioned above, that is, a design method for a clock distributing circuit as the second embodiment of the present invention will be described according to a flowchart (steps S21 to S33, S11 to S15, S161, and S17) shown in FIG. 15.

In the design apparatus of the second embodiment, if a net list including at least one specific element, obtained as a result of a logical design, is input to the design apparatus, the selection section 17 selects a single specific element (step S21) and also recognizes a region where the specific element can be disposed and selects a plurality of specific-element disposition candidate positions within the region (step S22: selection step). Note that in the case where in step S21 a single specific element is selected from among a plurality of specific elements, a specific element nearer to a specific clock-receiving element is selected in sequence.

One of the specific-element disposition candidate positions selected in step S22 is selected (step S23), and a signal line is temporarily wired by the temporary wiring section 11A so that the specific element disposed at the selected specific-element disposition candidate position is connected directly with each of the specific clock-receiving elements corresponding to the specific element through the shortest path (step S24: second temporary wiring step).

It is judged by the judgement section 12A whether or not the clock skew in the specific clock-receiving elements has been optimized by the temporarily wired signal line (step S25: second judgement step). If it is judged that the clock skew has not been optimized ("NO" route in step S25), the specific clock-receiving elements are divided into a plurality of groups by the grouping section 13A (step S26: second grouping step). The number of specific clock-receiving elements that are included in each group is determined, for example, according to the characteristic (output-driving ability, etc.) of a buffer that is inserted. In addition, a predetermined number of specific clock-receiving elements close to one another are basically collected into a single group.

Thereafter, in each group divided in step S26, a buffer is inserted and disposed (step S27: second buffer insertion step). In this step S27, the following steps S271 to S279 are performed by the buffer insertion section 14A.

One of the groups divided in step S26 is first selected (step S271), and a single buffer is assigned to the selected group (step S272). Then, a region where the buffer can be disposed is recognized, and within the region, a plurality of buffer-insertion candidate positions are selected (step S273).

Furthermore, one of the buffer-insertion candidate positions selected in step S273 is selected (step S274). A signal line is temporarily wired so that the buffer disposed at the selected buffer-insertion candidate position is connected with each of the specific clock-receiving elements belonging to the group selected in step S271, through the shortest path. Also, a signal line is temporarily wired so that the buffer disposed at the selected buffer-insertion candidate position is connected with the specific element through the shortest path. The delay time due to these signal lines is calculated. The delay time obtained here is held as a solution in memory etc., along with information about the buffer-insertion candidate position and the wiring path (step S275).

The above-mentioned steps S274 and S275 are executed for all the buffer-insertion candidate positions selected in step S273. That is, in step S276, steps S274 and S275 are repeatedly executed until it is judged that execution of steps S274 and S275 has ended for all the buffer-insertion candidate positions.

If it is judged that execution of steps S274 and S275 has ended for all the buffer-insertion candidate positions ("YES" route in step S276), a buffer-insertion candidate position which can optimize the clock skew and clock propagation delay time in the specific clock-receiving elements belonging to the selected group is selected from among a plurality of buffer-insertion candidate positions, based on the delay times obtained for all the buffer-insertion candidate positions (step S277).

Thereafter, a buffer is inserted and disposed at the candidate position selected in step S277 (step S278). The buffer that is inserted is selected based on the temporary wiring result obtained in step S275. That is, the buffer has a characteristic of being able to optimize the clock propagation delay time from the buffer to the clock-receiving elements belonging to the group into which the buffer is inserted.

The above-mentioned steps S271 to S278 are executed on all the groups divided in step S26. That is, in step S279, steps S271 to S278 are repeatedly executed until it is judged that execution of steps S271 to S278 has ended for all the groups.

If it is judged that execution of steps S271 to S278 has ended for all the groups ("YES" route in step S279), the buffers inserted into the groups by the buffer insertion section 14 are regarded as specific clock-receiving elements (step S28), and the process returns to step S24.

The above-mentioned steps S24 to S28 are repeatedly executed until it is judged in step S25 that the clock skew has been optimized. If it is judged in step S25 that the clock skew has been optimized ("YES" route), the temporary specific-element wiring section 19 temporarily wires a signal line which connects the clock-supplying element with the specific element disposed at each specific-element disposition candidate position through the shortest path (step S29: third temporary wiring step).

Furthermore, the above-mentioned steps S24 to S29 are executed for all the specific-element disposition candidate positions selected in step S22. That is, in step S30, steps S24 to S29 are repeatedly executed until it is judged that execution of steps S24 to S29 has ended for all the specific-element disposition candidate positions.

If it is judged that execution of steps S24 to S29 has ended for all the specific-element disposition candidate positions ("YES" route in step S30), the specific-element disposing position selected in step S21 is determined and a specific element is disposed at the determined position (step S31: specific-element disposing step). In this step S31, the specific-element disposing section 20 executes steps S311 and S312 described below.

That is, based on the temporary wiring results obtained in steps S24, S275, and S29 for all the specific-element disposition candidate positions, a specific-element disposition candidate position which can optimize the clock skew and clock propagation delay time in specific clock-receiving elements is selected from a plurality of specific-element disposition candidate positions (step S311), and a specific element is disposed at the selected candidate position. Also, the temporary wiring result and the buffer-inserting position, obtained in step S27 with respect to the selected candidate position, are adopted (step S312).

The above-mentioned steps S21 to S31 are executed on all the specific elements included in the net list. That is, in step S32, steps S21 to S31 are repeatedly executed until it is judged that execution of steps S21 to S31 has ended for all the specific elements.

If it is judged that execution of steps S21 to S31 has ended for all the specific elements ("YES" route in step S32), a plurality of clock-receiving elements excluding the specific clock-receiving elements, and the specific element disposed in step S31, are regarded as a plurality of clock-receiving elements (step S33). And steps nearly similar to the first embodiment (steps S11 to S15, S161, and S17) are executed.

In step S161 (final wiring step), which is executed in the second embodiment instead of step S16 of the first embodiment, the final wiring section 15A determines the wiring paths of signal lines, which connect a clock-supplying element, a plurality of clock-receiving elements, buffers, and specific elements, according to the temporary wiring result adopted in the step S31 and the temporary wiring results obtained in steps S11 and S14.

Figure 16:
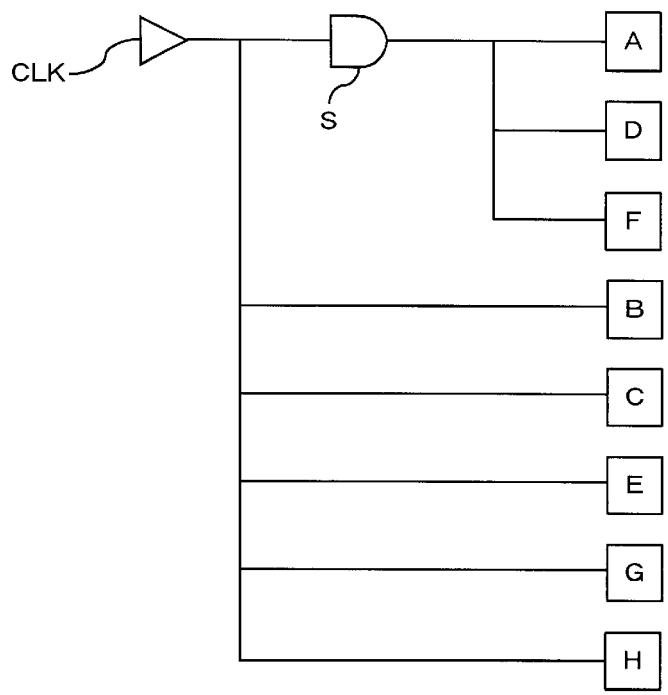
FIGS. 16 and 17 are diagrams used to explain a specific design operation of the second embodiment.

Next, the design operation of the second embodiment will be described in further detail with respect to FIGS. 16 and 17. As shown in FIG. 16, a single clock-supplying element CLK, a specific element S such as a selector, an inverter, etc., and 8 (eight) clock-receiving elements A to H, are input to the design apparatus by the net list. A description will be given in the case where a clock distributing circuit is designed between these elements. In this case, assume that the specific element S is interposed between the clock-supplying element CLK and three specific clock-receiving elements A, D, F. Also, assume that the clock-supplying element CLK and the clock-receiving elements A to H are disposed at the same positions as those shown in FIGS. 3 to 9.

Figure 17:
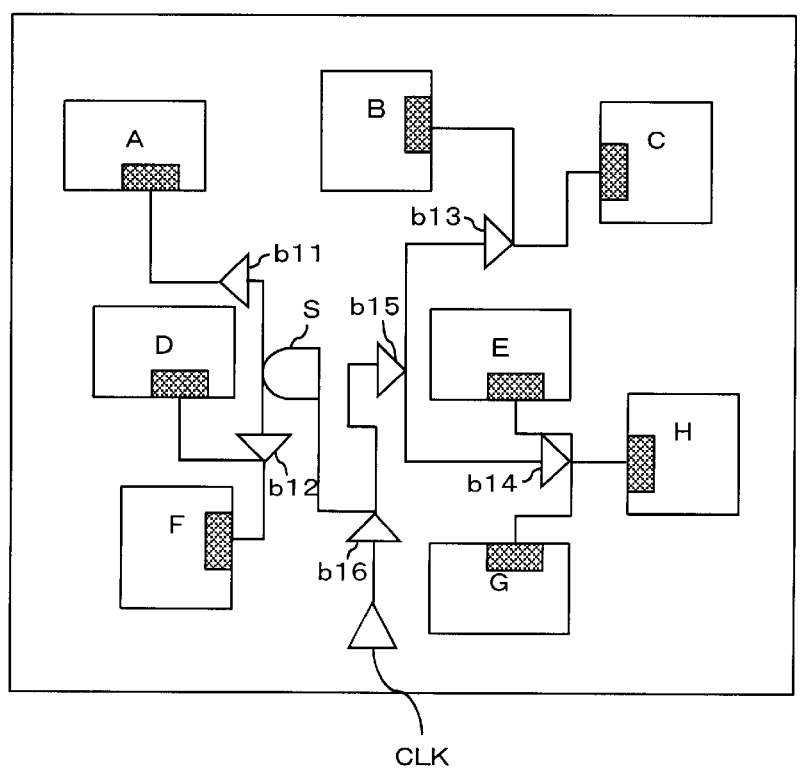

If the net list with information shown in FIG. 16 is input to the design apparatus, the position of the specific element S with respect to three specific clock-receiving elements A, D, F is determined as shown in FIG. 17. Also, insertion of buffers b11, b12 and temporary wiring are performed between the three specific clock-receiving elements A, D, F and the specific element S.

Thereafter, the specific element S and the remaining clock-receiving elements B, C, E, G, and H are regarded as clock-receiving elements, and the same steps as the first embodiment, that is, the above-mentioned steps S11 to S15, S161, and S17 are executed. Between the clock-supplying element CLK and the clock-receiving elements B, C, E, G, and H, buffers b13 to b16 are inserted and disposed and wiring paths are determined. Furthermore, after the characteristic of the clock-supplying element CLK is determined, a clock tree (clock distributing circuit) such as that shown in FIG. 17 is finally generated.

Thus, in the second embodiment of the present invention, when a net list with a specific element between a clock-supplying element and clock-receiving elements is input, the specific element is regarded as a movable clock-supplying element. Then, with respect to specific elements disposed at a plurality of specific-element disposition candidate positions, the positions of buffers and the wiring paths are determined in the same manner as the first embodiment. Next, based on the result of determination, the most suitable position of the specific element is determined. Thereafter, the specific element and the remaining clock-receiving elements are regarded as clock-receiving elements, and the method of the first embodiment is applied.

Therefore, even in the case where a specific element is previously inserted into a circuit, the position of the specific element with respect to specific clock-receiving elements, along with the wiring paths between the specific element and the specific clock-receiving elements, is determined while adjusting both a wired state and buffer positions. As a result, the clock propagation delay time and clock skew of the entire circuit are simultaneously and reliably optimized.

[3] Third Embodiment

Figure 18:
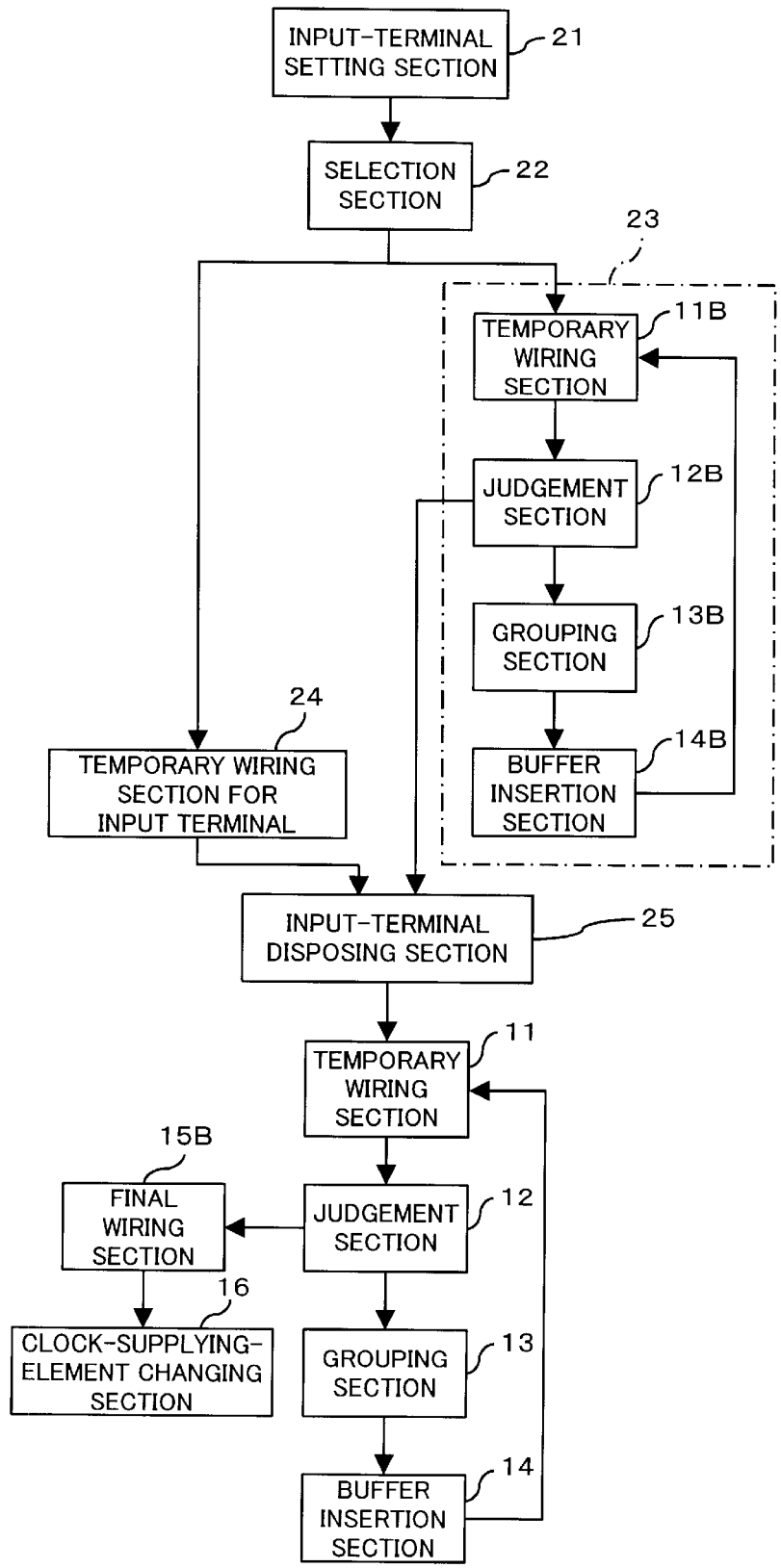
FIG. 18 is a block diagram of an apparatus for designing a clock distributing circuit, constructed according to a third embodiment of the present invention.

FIG. 18 shows an apparatus for designing a clock distributing circuit, constructed according to a third embodiment of the present invention. In the figure, the same reference numerals denote the same parts as the aforementioned embodiments or nearly the same parts. Therefore, a detailed description is omitted for avoiding redundancy.

The third embodiment will be described with regard to the case where a circuit hierarchically designed is input (i.e., the case where a plurality of clock-receiving elements belong to the different logical hierarchies). In such a case, the design apparatus of the third embodiment, as described later, is used to design a clock distributing circuit (clock tree) so that the boundary of the logical hierarchy does not change. Note that a net list in the third embodiment includes information about clock-supplying elements, clock-receiving elements, and logical hierarchies. However, the net list does not include information about buffers, as with the net list of the first embodiment.

The design apparatus of the third embodiment is equipped with a temporary wiring section 11, a judgement section 12, a grouping section 13, a buffer insertion section 14, a final wiring section 15B, and a clock-supplying-element changing section 16, as with the first embodiment, as shown in FIG. 14. The design apparatus is further equipped with an input-terminal setting section 21, a selection section 22, an input-terminal design section 23, a temporary input-terminal wiring section (temporary wiring section for input terminal) 24, and an input-terminal disposing section 25, at the first stage before the temporary wiring section 11.

The input-terminal setting section 21 sets a virtual input terminal which is connected to clock-receiving elements belonging to each logical hierarchy (hereinafter referred to as hierarchical clock-receiving elements), assuming that the input terminal is present on the boundary of the logical hierarchy.

The selection section 22 selects, on a chip, a plurality of input-terminal disposition candidate positions where each input terminal set by the input-terminal setting section 21 can be disposed.

The input-terminal design section 23 performs the insertion of buffers and the temporary wiring of signal lines between an input terminal, disposed at each input-terminal disposition candidate position selected by the selection section 22, and hierarchical clock-receiving elements, connected to this input terminal and disposed at predetermined positions. For this reason, the input-terminal design section 23 is equipped with a temporary wiring section 11B, a judgement section 12B, a grouping section 13B, and a buffer insertion section 14B. The temporary wiring section 11B, judgement section 12B, grouping section 13B, and buffer insertion section 14B fulfill nearly the same functions as the temporary wiring section 11, judgement section 12, grouping section 13, and buffer insertion section 14 described in the first embodiment.

More specifically, the temporary wiring section (second temporary wiring section) 11B temporarily wires a signal line which connects an input terminal, disposed at each input-terminal disposition candidate position, directly with each of hierarchical clock-receiving elements disposed at predetermined positions on the chip, through the shortest path. That is, the temporary wiring section 11B temporarily wires the shortest signal line which directly supplies a clock signal from the input terminal to all the hierarchical clock-receiving elements so that the clock propagation delay time can be optimized.

The judgement section (second judgement section) 12B judges whether or not the clock skew in the hierarchical clock-receiving elements has been optimized by the signal line temporarily wired by the temporary wiring section 11B.

The grouping section (second grouping section) 13B divides the hierarchical clock-receiving elements into a plurality of groups when it is judged by the judgement section 12B that the clock skew has not been optimized.

The buffer insertion section (second buffer insertion section) 14B selects a buffer which is inserted between the input terminal, and the hierarchical clock-receiving elements belonging to each group obtained by the grouping section 13B. The buffer is selected so that clock propagation delay time and clock skew become optimum. The buffer insertion section 14 also determines a position where the buffer is disposed, and performs temporary wiring from the selected buffer to the hierarchical clock-receiving elements selected by the grouping section 13B.

More specifically, the buffer insertion section 14B has functions (21) to (26) corresponding to the functions (1) to (6) of the buffer insertion section 14 described in the first embodiment as follows:

the function (21) of assigning a single buffer to each of the groups obtained by the grouping section 13B;

the function (22) of selecting, on the chip, a plurality of buffer-insertion candidate positions where the buffer assigned by the function (21) can be inserted and disposed;

the function (23) of temporarily wiring, for each buffer-insertion candidate position selected by the function (22), a signal line which connects the buffer, disposed at the buffer-insertion candidate position, with each of the hierarchical clock-receiving elements belonging to the group through the shortest path, and also temporarily wiring a signal line which connects the buffer, disposed at the buffer-insertion candidate position, with the input terminal through the shortest path;

the function (24) of selecting a buffer-insertion candidate position, which can optimize the clock skew and clock propagation delay time in the hierarchical clock-receiving elements belonging to the group, from among a plurality of buffer-insertion candidate positions, based on the temporary wiring results obtained for all the buffer-insertion candidate positions by the function (23);

the function (25) of inserting and disposing the assigned buffer at the candidate position selected by the function (24); and the function (26) of selecting, as the buffer that is inserted into each group, a buffer which has a characteristic of being able to optimize the clock propagation delay time from the buffer to the hierarchical clock-receiving elements belonging to the group.

In the input-terminal design section 23 of the third embodiment, the temporary wiring section 11B, judgement section 12B, grouping section 13B, and buffer insertion section 14B operate repeatedly for each of the input-terminal disposition candidate positions selected by the selection section 22, while the buffers inserted into a plurality of groups by the buffer insertion section 14B are being regarded as hierarchical clock-receiving elements, until it is judged by the judgement section 12B that clock skew has been optimized.

The temporary input-terminal wiring section 24 temporarily wires a signal line which connects the clock-supplying element with the input terminal disposed at each input-terminal disposition candidate position selected by the selection section 22 through the shortest path.

The input-terminal disposing section 25 selects an input-terminal disposition candidate position, which can optimize the clock skew and clock propagation delay time in hierarchical clock-receiving elements, from among a plurality of input-terminal disposition candidate positions, based on the temporary wiring results obtained for all the input-terminal disposition candidate positions by the input-terminal design section 23 and the temporary input-terminal wiring section 24. Furthermore, the input-terminal disposing section 25 disposes a virtual terminal at the selected candidate position, and adopts the temporary wiring result and the buffer-inserting position obtained for the selected candidate position.

Next, in the design apparatus of the third embodiment, a plurality of input terminals disposed for each of the logical hierarchies by the input-terminal disposing section 25 are regarded as a plurality of clock-receiving elements. As with the design apparatus of the first embodiment, the temporary wiring section 11, judgement section 12, grouping section 13, and buffer insertion section 14, final wiring section 15B, and clock-supplying element changing section 16 are operated.

Note that the final wiring section 15B of the third embodiment determines the wiring paths of signal lines which connect a clock-supplying element, a plurality of clock-receiving elements, buffers, and virtual input terminals, according to the temporary wiring result adopted by the input-terminal disposing section 25, the temporary wiring results obtained by the temporary wiring section 11 and buffer insertion section 14, and the position of the virtual input terminal determined by the input-terminal disposing section 25.

The above-mentioned temporary wiring section 11, judgement section 12, grouping section 13, buffer insertion section 14, final wiring section 15B, clock-supplying element changing section 16, input-terminal setting section 21, selection section 22, input-terminal design section 23, temporary input-terminal wiring section 24, and input-terminal disposing section 25 are realized by dedicated software (design program for the clock distributing circuit), as with the first embodiment.

This design program, as with the first embodiment, is provided, for example, in a form of being recorded on a computer readable storage medium such as a flexible disk, a CD-ROM, etc. As with the first embodiment, a design program is previously stored in a read-only memory (not shown), etc. which form part of the design apparatus, and this design program is read out and executed by a central processing unit (not shown) that also forms part of the design apparatus. In this manner, the functions of the above-mentioned temporary wiring section 11, judgement section 12, grouping section 13, and buffer insertion section 14, final wiring section 15B, clock-supplying element changing section 16, input-terminal setting section 21, selection section 22, input-terminal design section 23, temporary input-terminal wiring section 24, and input-terminal disposing section 25 are realized.

In the third embodiment, as with the second embodiment, the temporary wiring section 11 may also function as the temporary input-terminal wiring section 24 and the temporary wiring section 11B, and the judgement section 12, the grouping section 13 and the buffer insertion section 14 may also function as the judgement section 12B, the grouping section 13B, and the buffer insertion section 14B.

Figure 19:
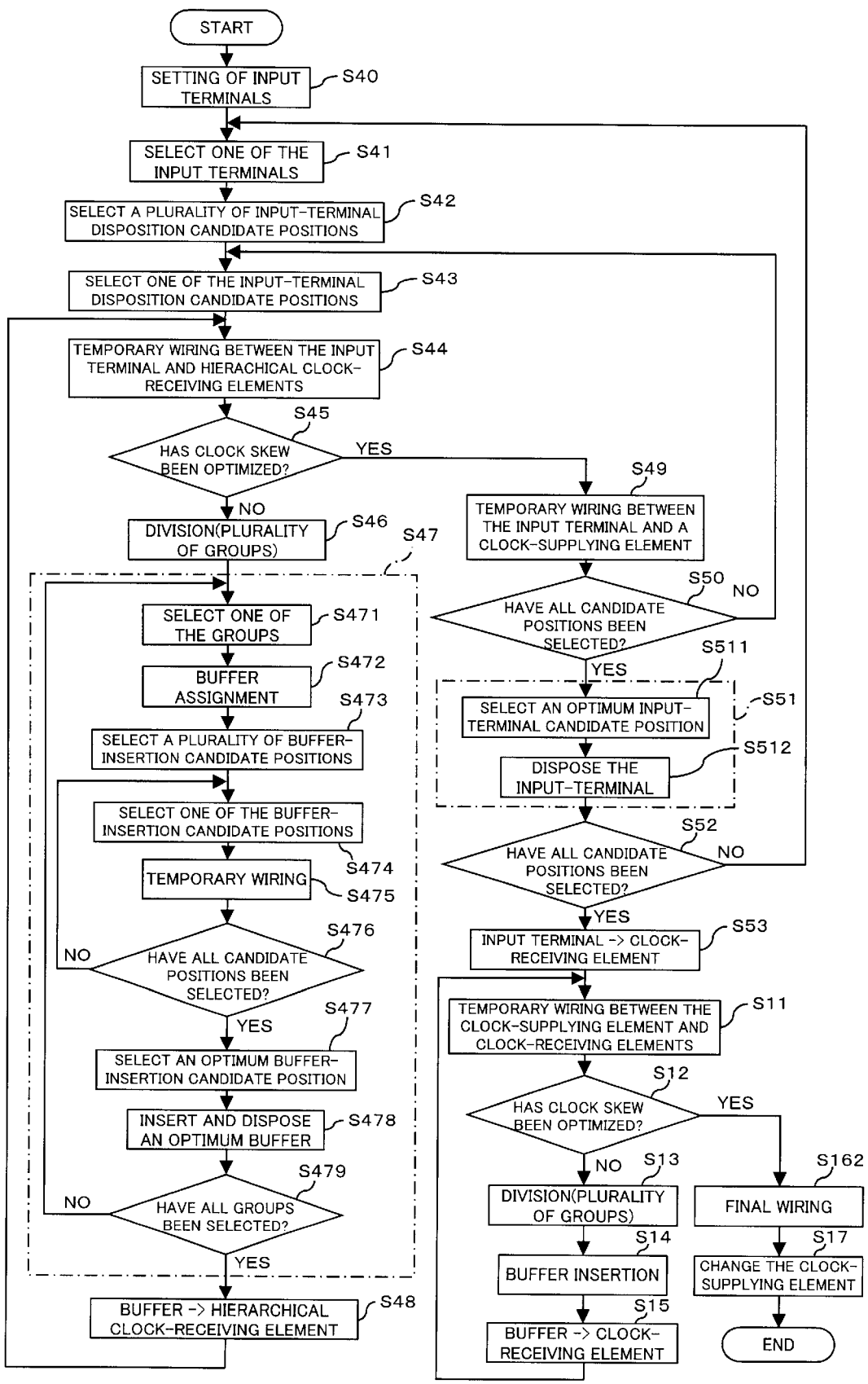
FIG. 19 is a flowchart used for explaining the design method of the third embodiment of the present invention.

Next, operation of the design apparatus of the third embodiment mentioned above, that is, a design method for a clock distributing circuit as the third embodiment of the present invention will be described according to a flowchart (steps S40 to S53, S11 to S15, S162, and S17) shown in FIG. 19.

In the design apparatus of the third embodiment, if a net list hierarchically designed as a result of a logical design is input to the design apparatus, the input-terminal setting section 21 sets a virtual input terminal which is connected to hierarchical clock-receiving elements belonging to each logical hierarchy (step S40: input-terminal setting step). Next, the selection section 22 selects a single input terminal (step S41) and also recognizes a region where the input terminal can be disposed and selects a plurality of input-terminal disposition candidate positions within the region (step S42: selection step).

One of the input-terminal disposition candidate positions selected in step S42 is selected (step S43), and a signal line is temporarily wired by the temporary wiring section 11B so that the input terminal disposed at the selected input-terminal disposition candidate position is connected directly with each of the hierarchical clock-receiving elements corresponding to the input terminal through the shortest path (step S44: second temporary wiring step).

It is judged by the judgement section 12B whether or not the clock skew in the hierarchical clock-receiving elements has been optimized by the temporarily wired signal line (step S45: second judgement step). If it is judged that the clock skew has not been optimized ("NO" route in step S45), the hierarchical clock-receiving elements are divided into a plurality of groups by the grouping section 13B (step S46: second grouping step). The number of hierarchical clock-receiving elements that are included in each group is determined, for example, according to the characteristic (output-driving ability, etc.) of a buffer that is inserted. In addition, a predetermined number of hierarchical clock-receiving elements close to one another are basically collected into a single group.

Thereafter, in each group divided in step S46, a buffer is inserted and disposed (step S47: second buffer insertion step). In this step S47, the following steps S471 to S479 are performed by the buffer insertion section 14B.

One of the groups divided in step S46 is first selected (step S471), and a single buffer is assigned to the selected group (step S472). Then, a region where the buffer can be disposed is recognized, and within the region, a plurality of buffer-insertion candidate positions are selected (step S473).

Furthermore, one of the buffer-insertion candidate positions selected in step S473 is selected (step S474). A signal line is temporarily wired so that the buffer disposed at the selected buffer-insert ion candidate position is connected with each of the hierarchical clock-receiving elements belonging to the group selected in step S471, through the shortest path. Also, a signal line is temporarily wired so that the buffer disposed at the selected buffer-insertion candidate position is connected with the input terminal through the shortest path. The delay time due to these signal lines is calculated. The delay time obtained here is held as a solution in memory etc., along with information about the buffer-insertion candidate position and the wiring path (step S475).

The above-mentioned steps S474 and S475 are executed for all the buffer-insertion candidate positions selected in step S473. That is, in step S476, steps S474 and S475 are repeatedly executed until it is judged that execution of steps S474 and S475 has ended for all the buffer-insertion candidate positions.

If it is judged that execution of steps S474 and S475 has ended for all the buffer-insertion candidate positions ("YES" route in step S476), a buffer-insertion candidate position which can optimize the clock skew and clock propagation delay time in the hierarchical clock-receiving elements belonging to the selected group is selected from among a plurality of buffer-insertion candidate positions, based on the delay times obtained for all the buffer-insertion candidate positions (step S477).

Thereafter, a buffer is inserted and disposed at the candidate position selected in step S477 (step S478). The buffer that is inserted is selected based on the temporary wiring result obtained in step S475. That is, the buffer has a characteristic of being able to optimize the clock propagation delay time from the buffer to the clock-receiving elements belonging to the group into which the buffer is inserted.

The above-mentioned steps S471 to S478 are executed on all the groups divided in step S46. That is, in step S479, steps S471 to S478 are repeatedly executed until it is judged that execution of steps S471 to S478 has ended for all the groups.

If it is judged that execution of steps S471 to S478 has ended for all the groups ("YES" route in step S479), the buffers inserted into the groups by the buffer insertion section 14B are regarded as hierarchical clock-receiving elements (step S48), and the process returns to step S44.

The above-mentioned steps S44 to S48 are repeatedly executed until it is judged in step S45 that the clock skew has been optimized. If it is judged in step S45 that the clock skew has been optimized ("YES" route), the temporary input-terminal wiring section 24 temporarily wires a signal line which connects the clock-supplying element with the input terminal disposed at each input-terminal disposition candidate position through the shortest path (step S49: third temporary wiring step).

If it is judged that execution of steps S44 to S49 has ended for all the input-terminal disposition candidate positions ("YES" route in step S50), the input-terminal disposing position selected in step S41 is determined and an input terminal is disposed at the determined position (step S51: input-terminal disposing step). In this step S51, the input-terminal disposing section 25 executes steps S411 and S412 described below.

That is, based on the temporary wiring results obtained in steps S44, S475, and S49 for all the input-terminal disposition candidate positions, an input-terminal disposition candidate position which can optimize the clock skew and clock propagation delay time in hierarchical clock-receiving elements is selected from a plurality of input-terminal disposition candidate positions (step S411), and a virtual input terminal is disposed at the selected candidate position. Also, the temporary wiring result and the buffer-inserting position, obtained in step S47 with respect to the selected candidate position, are adopted (step S412). Practically, a buffer with suitable output-driving ability, for example, is disposed at the input-terminal disposing position determined in the above-mentioned manner (see FIG. 21)

The above-mentioned steps S41 to S51 are executed on all the input terminals set in step S40. That is, in step S52, steps S41 to S51 are repeatedly executed until it is judged that execution of steps S41 to S51 has ended for all the input terminals.

If it is judged that execution of steps S41 to S51 has ended for all the input terminals ("YES" route in step S52), the virtual input terminals (buffers) disposed in hierarchies in step S51 are regarded as a plurality of clock-receiving elements (step S53), and steps nearly similar to the first embodiment (steps S11 to S15, S162, and S17) are executed.

In step S162 (final wiring step), which is executed in the third embodiment instead of step S16 of the first embodiment, the final wiring section 15B determines the wiring paths of signal lines, which connect a clock-supplying element, a plurality of clock-receiving elements, buffers, and virtual input terminals, according to the temporary wiring result adopted in the step S51, and the temporary wiring results obtained in steps S11 and S14, and the positions of the input terminals.

Figure 20:
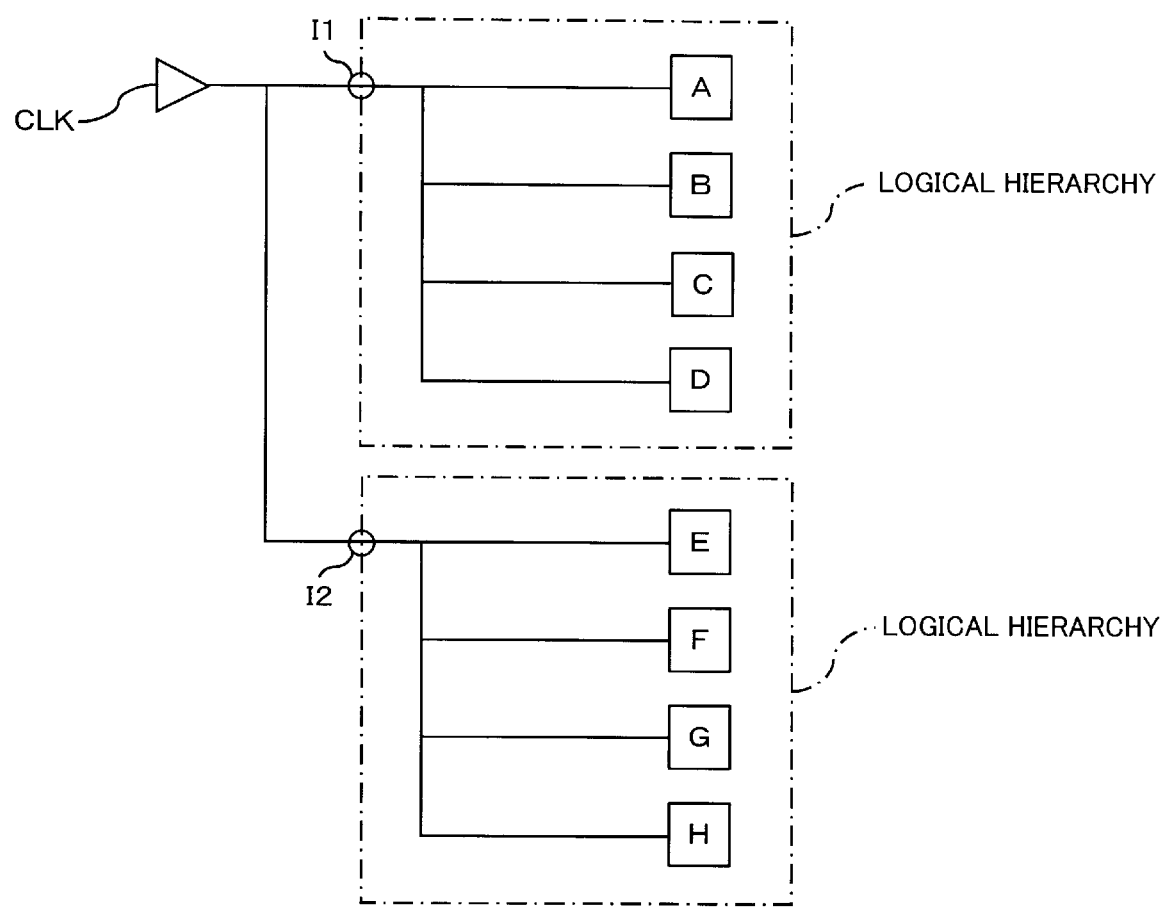
FIGS. 20 and 21 are diagrams used for explaining a specific design operation of the third embodiment.
Figure 21:
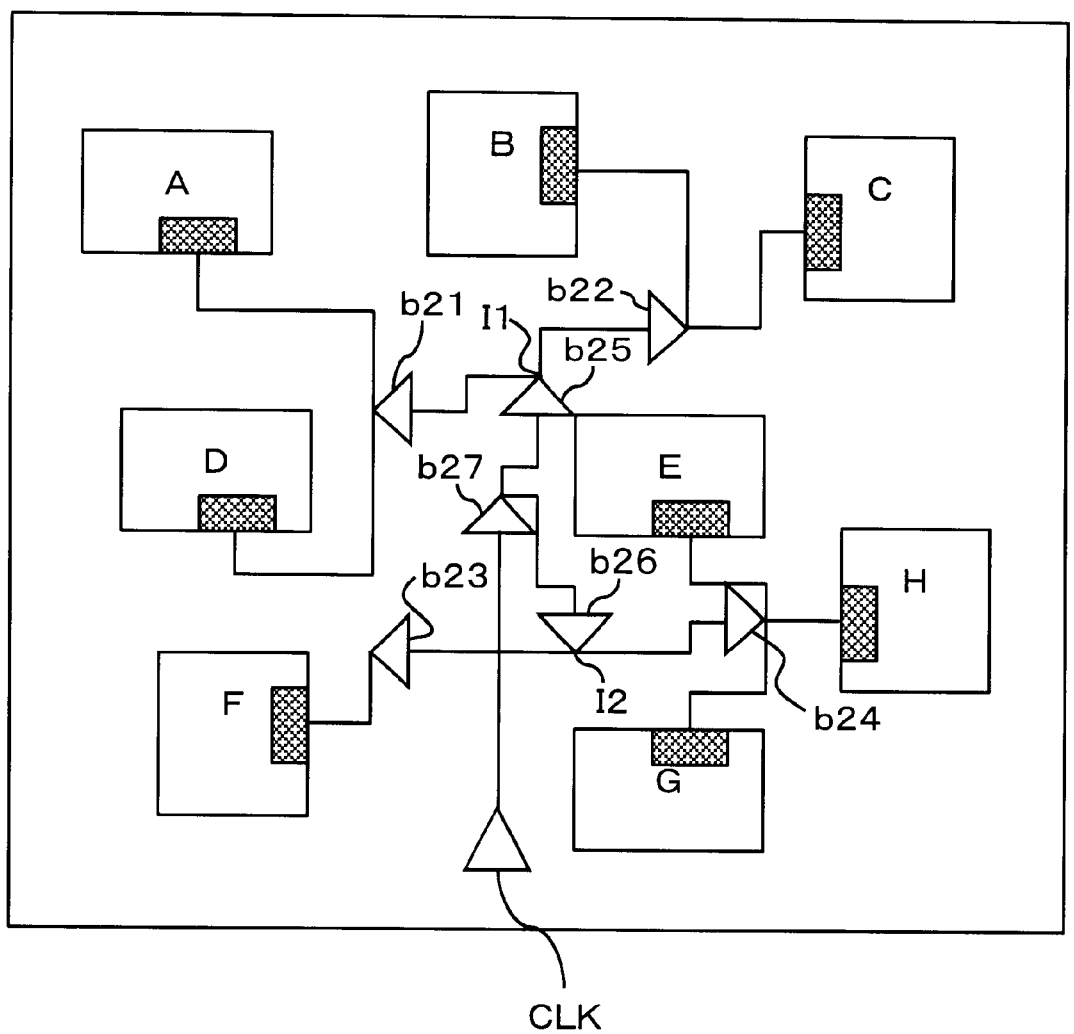

Next, the design operation of the third embodiment will be described in further detail with respect to FIGS. 20 and 21. As shown in FIG. 20, a description will be given in the case where a circuit with two logical hierarchies is given by a net list. This net list, as with the first embodiment, includes a single clock-supplying element CLK and 8 (eight) clock-receiving elements A to H. However, the clock-receiving elements A to D belong to one logical hierarchy and the clock-receiving elements E to H belong to another logical hierarchy. A clock distributing circuit between these elements will be described. Also, the clock-supplying element CLK and the clock-receiving elements A to H are disposed at the same positions as those shown in FIGS. 3 to 9.

If the net list with information shown in FIG. 20 is input to the design apparatus, virtual input terminals I1, I2 for the logical hierarchies are set in the above-mentioned step S40. In the above-mentioned steps S41 to S52, the position of the input terminal I1 (buffer b25) with respect to four hierarchical clock-receiving elements A to D is determined as shown in FIG. 21. Also, insertion of buffers b21, b22 and temporary wiring are performed between the four hierarchical clock-receiving elements A to D and the input terminal I1. Similarly, the position of the input terminal I2 (buffer b26) with respect to four hierarchical clock-receiving elements E to H is determined, and insertion of buffers b23, b24 and temporary wiring are performed between the four hierarchical clock-receiving elements E to H and the input terminal I2.

Thereafter, the two buffers b25 and b26 that are disposed at the two input terminals I1 and I2 are regarded as clock-receiving elements, and the same steps as the first embodiment, that is, the above-mentioned steps S11 to S15, S162, and S17 are executed. Between the clock-supplying element CLK and the two buffers b25, b26, a buffer b27 is inserted and disposed and wiring paths are determined. Furthermore, after the characteristic of the clock-supplying element CLK is determined, a clock tree such as that shown in FIG. 21 (clock distributing circuit) is finally generated.

Thus, in the third embodiment of the present invention, in the case where clock-receiving elements are present in a plurality of logical hierarchies, the positions of buffers and the wiring paths are determined so that a virtual input terminal set on the boundary of the logical hierarchy is not changed. In this manner, a clock tree is generated.

Therefore, even in the case where a plurality of clock-receiving elements belong to different logical hierarchies, the position of an input terminal with respect to hierarchical clock-receiving elements, along with the wiring path between the input terminal and the hierarchical clock-receiving elements, is determined while adjusting both a wired state and buffer positions. As a result, the clock propagation delay time and clock skew of the entire circuit are simultaneously and reliably optimized.

[4] Others

While the present invention has been described with reference to the preferred embodiments thereof, the invention is not to be limited to the details given herein, but may be modified within the scope of the invention hereinafter claimed.

For example, a clock distributing circuit may be designed by combining the above-mentioned first, second, and third embodiments and the first and second modifications of the first embodiment according to the contents of a net list which is input to the design apparatus of the present invention.

What is claimed is:

1. A method of designing a clock distributing circuit which distributes and supplies a clock signal from at least one clock-supplying element to a plurality of clock-receiving elements, comprising:

a first temporary wiring temporarily wiring a signal line which directly connects said clock-supplying element with each of said clock-receiving elements disposed at predetermined positions, through the shortest path, and fixing the temporary wiring result which should be adopted in after-mentioned final wiring;

a first judgment judging whether or not clock skew in said plurality of clock-receiving elements has been optimized by said signal line temporarily wired in said first temporary wiring;

a first grouping dividing said plurality of clock-receiving elements into a plurality of groups when it is judged in said first judgement that said clock skew has not been optimized;

a first buffer insertion (a) assigning a single buffer to each of said groups obtained by said first grouping, (b) lining-up a plurality of buffer-insertion candidate positions where said buffer can be inserted and disposed, (c)

temporarily wiring, for each of the lined-up buffer-insertion candidate positions, both a signal line which connects said buffer, disposed at said buffer-insertion candidate position, with each of said clock-receiving elements belonging to said group through the shortest path, and a signal line which connects said buffer, disposed at said buffer-insertion candidate position, with said clock-supplying element through the shortest path, and fixing the temporary wiring results should be adopted in after-mentioned final wiring, (d) selecting a buffer-insertion candidate position, which can optimize clock skew and clock propagation delay time in said clock-receiving elements belonging to said group, from among said plurality of buffer-insertion candidate positions, based on temporary wiring results obtained for all of said plurality of buffer-insertion candidate positions, to determine the selected buffer-insertion candidate position as a position where said buffer should be actually inserted and disposed, and (e) inserting and disposing said buffer at the selected candidate position, while obtaining the temporary wiring results; and a final wiring determining wiring paths of signal lines which connect said clock-supplying element, said plurality of clock-receiving elements, and said buffer, according to the temporary wiring results obtained in said first temporary wiring and said first buffer insertion;

wherein said first temporary wiring, said first judgement, said first grouping, and said first buffer insertion are repeatedly executed, while the buffers inserted into said plurality of groups by said first buffer insertion are being regarded as said plurality of clock-receiving elements, until it is judged in said first judgement that the clock skew has been optimized;

and wherein said final wiring is executed when it is judged in said first judgement that the clock skew has been optimized.

2. The method as set forth in claim 1, wherein said first buffer insertion selects a buffer, which has a characteristic of being able to optimize the clock propagation time from said buffer to said clock-receiving elements belonging to said group, as said buffer that is inserted into said group.

3. The method as set forth in claim 1, further comprising, when said plurality of clock-supplying elements belong to different logical hierarchies, an input-terminal setting setting a virtual input terminal which is connected to said clock-receiving elements belonging to each of said logical hierarchies (hereinafter referred to as hierarchical clock-receiving elements);

a selection selecting a plurality of input-terminal disposition candidate positions where each input terminal set in said input-terminal setting can be disposed;

a second temporary wiring temporarily wiring a signal line which connects said input terminal, disposed at said input-terminal disposition candidate position, directly with each of said hierarchical clock-receiving elements connected to said input terminal and disposed at predetermined positions, through the shortest path;

a second judgement judging whether or not clock skew in said hierarchical clock-receiving elements has been optimized by said signal line temporarily wired in said second temporary wiring;

a second grouping dividing said hierarchical clock-receiving elements into a plurality of groups when it is judged in said second judgement that said clock skew has not been optimized;

a second buffer insertion (a) assigning a single buffer to each of said groups obtained by said second grouping, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said hierarchical clock-receiving elements belonging to said group through the shortest path, and a signal line which connects said buffer, disposed at said buffer-insertion candidate position, with said input terminal through the shortest path, (d) selecting a buffer-insertion candidate position, which can optimize clock skew and clock propagation delay time in said hierarchical clock-receiving elements belonging to said group, from among said plurality of buffer-insertion candidate positions, based on temporary wiring results obtained for each of said buffer-insertion candidate positions, and (e) inserting and disposing said buffer at the selected candidate position;

a third temporary wiring temporarily wiring a signal line which connects said clock-supplying element with said input terminal disposed at each of said input-terminal disposition candidate positions, through the shortest path; and an input-terminal disposing (a) selecting an input-terminal disposition candidate position, which can optimize the clock skew and clock propagation delay time in said hierarchical clock-receiving elements, from among said plurality of input-terminal disposition candidate positions, based on the temporary wiring results obtained in said second temporary wiring, said second buffer insertion, and said third temporary wiring for all of said plurality of input-terminal disposition candidate positions, (b) disposing said input terminal at the selected candidate position, and (c) adopting the temporary wiring result and the buffer-inserting position obtained for the selected candidate position;

wherein said input-terminal setting, said selection, said second temporary wiring, said second judgement, said second grouping, said second buffer insertion, said third temporary wiring and said input-terminal disposing are executed prior to execution of said first temporary wiring;

wherein, for each of said input-terminal disposition candidate positions selected in said selection, said second temporary wiring, said second judgement, said second grouping, and said second buffer insertion are repeatedly executed, while the buffers inserted into said plurality of groups by said second buffer insertion are being regarded as said hierarchical clock-receiving elements, until it is judged in said second judgement that the clock skew has been optimized, and said third temporary wiring is executed when it is judged in said second judgement that the clock skew has been optimized;

wherein said input-terminal disposing is executed after execution of said second temporary wiring, said second judgement, said second grouping, said second buffer insertion, and said third temporary wiring for all of said plurality of input-terminal disposition candidate positions;

and wherein, after the execution of said input-terminal disposing, said first temporary wiring, said first judgement, said first grouping, said first buffer insertion, and said final wiring are repeatedly executed, while a plurality of input terminals disposed in said input-terminal disposing for each of said logical hierarchies are being regarded as said plurality of clock-receiving elements, and in said final wiring, wiring paths of signal lines, which connect said clock-supplying element, said plurality of clock-receiving elements, said buffer, and said input terminal, is determined according to the temporary wiring result adopted in said input-terminal disposing, the temporary wiring results obtained in said first temporary wiring and said first buffer insertion, and the position of said input terminal.

4. The method as set forth in claim 3, wherein said second buffer insertion selects a buffer, which has a characteristic of being able to optimize the clock propagation time from said buffer to said clock-receiving elements belonging to said group, as said buffer that is inserted into said group.

5. The method as set forth in claim 1, further comprising a clock-supplying-element changing said clock-supplying element to an element having a characteristic of being able to optimize clock propagation delay time, based on the wiring result obtained in said final wiring.

6. The method as set forth in claim 1, wherein, when different clock skew restrictions are respectively given to said plurality of clock-receiving elements, the insertion and disposition of said buffer and the determination of the wiring paths of said signal lines are performed so that said restrictions are met.

7. The method as set forth in claim 1, wherein, when said clock-supplying element comprises two or more clock-supplying elements, said clock distributing circuit is designed for each of said two or more clock-supplying elements between the clock-supplying element and the clock-receiving elements to which said clock signal is supplied from the clock-supplying element, and between each of said clock-supplying elements and the clock distributing circuit designed for each of said clock-supplying elements, the insertion and disposition of said buffer and the determination of the wiring path of said signal line are performed so that the clock propagation delay times between the two or more clock-supplying elements and said plurality of clock-receiving elements coincide with each other.

8. A method of designing a clock distributing circuit which distributes and supplies a clock signal from at least one clock-supplying element to a plurality of clock-receiving elements, comprising:

a first temporary wiring temporarily wiring a signal line which directly connects said clock-supplying element with each of said clock-receiving elements disposed at predetermined positions, through the shortest path;

a first judgement judging whether or not clock skew in said plurality of clock-receiving elements has been optimized by said signal line temporarily wired in said first temporary wiring;

a first grouping dividing said plurality of clock-receiving elements into a plurality of groups when it is judged in said first judgement that said clock skew has not been optimized;

a first buffer insertion (a) assigning a single buffer to each of said groups obtained by said first grouping, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said clock-receiving elements belonging to said group through the shortest path, and a signal line which connects said buffer, disposed at said buffer-insertion candidate position, with said clock-supplying element through the shortest path, (d) selecting a buffer-insertion candidate position, which can optimize clock skew and clock propagation delay time in said clock-receiving elements belonging to said group, from among said plurality of buffer-insertion candidate positions, based on temporary wiring results obtained for all of said plurality of buffer-insertion candidate positions, and (e) inserting and disposing said buffer at the selected candidate position; and a final wiring determining wiring paths of signal lines which connect said clock-supplying element, said plurality of clock-receiving elements, and said buffer, according to the temporary wiring results obtained in said first temporary wiring and said first buffer insertion;

wherein said first temporary wiring, said first judgement, said first grouping, and said first buffer insertion are repeatedly executed, while the buffers inserted into said plurality of groups by said first buffer insertion are being regarded as said plurality of clock-receiving elements, until it is judged in said first judgement that the clock skew has been optimized;

a final wiring determining wiring paths of signal lines which connect said clock-supplying element, said plurality of clock-receiving elements, and said buffer, according to the temporary wiring results obtained in said first temporary wiring and said first buffer insertion;

a selection selecting a plurality of specific-element disposition candidate positions when a specific element is interposed between said clock-supplying element and specific clock-receiving elements (hereinafter referred to as specific clock-receiving elements);

a second temporary wiring temporarily wiring a signal line which connects said specific element, disposed at said specific-element disposition candidate position, directly with each of said specific clock-receiving elements disposed at predetermined positions, through the shortest path;

a second judgement judging whether or not clock skew in said specific clock-receiving elements has been optimized by said signal line temporarily wired in said second temporary wiring;

a second grouping dividing said specific clock-receiving elements into a plurality of groups when it is judged in said second judgement that said clock skew has not been optimized;

a second buffer insertion (a) assigning a single buffer to each of said groups obtained by said second grouping, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said specific clock-receiving elements belonging to said group through the shortest path, and a signal line which connects said buffer, disposed at said buffer-insertion candidate position, with said specific element through the shortest path, (d) selecting a buffer-insertion candidate position, which can optimize clock skew and clock propagation delay time in said specific clock-receiving elements belonging to said group, from among said plurality of buffer-insertion candidate positions, based on temporary wiring results obtained for each of said buffer-insertion candidate positions, and (e) inserting and disposing said buffer at the selected candidate position;

a third temporary wiring temporarily wiring a signal line which connects said clock-supplying element with said specific element disposed at each of said specific-element disposition candidate positions, through the shortest path; and a specific-element disposing (a) selecting a specific-element disposition candidate position, which can optimize the clock skew and clock propagation delay time in said specific clock-receiving elements, from among said plurality of specific-element disposition candidate positions, based on the temporary wiring results obtained in said second temporary wiring, said second buffer insertion, and said third temporary wiring for all of said plurality of specific-element disposition candidate positions, (b) disposing said specific element at the selected candidate position, and (c) adopting the temporary wiring result and the buffer-inserting position obtained for the selected candidate position; and wherein:

said selection, said second temporary wiring, said second judgement, said second grouping, said second buffer insertion, said third temporary wiring and said specific-element disposing are executed prior to execution of said first temporary wiring;

for each of said specific-element disposition candidate positions selected in said selection, said second temporary wiring, said second judgement, said second grouping, and said second buffer insertion are repeatedly executed, while the buffers inserted into said plurality of groups by said second buffer insertion are being regarded as said specific clock-receiving elements, until it is judged in said second judgement that the clock skew has been optimized, and said third temporary wiring is executed when it is judged in said second judgement that the clock skew has been optimized;

said specific-element disposing is executed after execution of said second temporary wiring, said second judgement, said second grouping, said second buffer insertion and said third temporary wiring for all of said plurality of specific-element disposition candidate positions;

after the execution of said specific-element disposing, said first temporary wiring, said first judgement, said first grouping, said first buffer insertion, and said final wiring are repeatedly executed, while said plurality of clock-receiving elements excluding said specific clocking-receiving element, and said specific element disposed in said specific-element disposing, are being regarded as said plurality of clock-receiving elements, and in said final wiring, wiring paths of signal lines, which connect said clock-supplying element, said plurality of clock-receiving elements, said buffer, and said specific element, is determined according to the temporary wiring result adopted in said specific-element disposing, the temporary wiring results obtained in said first temporary wiring and said first buffer insertion, and the position of said specific element; and said final wiring is executed when it is judged that the clock skew has been optimized.

9. The method as set forth in claim 8, wherein said second buffer insertion selects a buffer, which has a characteristic of being able to optimize the clock propagation time from said buffer to said clock-receiving elements belonging to said group, as said buffer that is inserted into said group.

10. An apparatus for designing a clock distributing circuit which distributes and supplies a clock signal from at least one clock-supplying element to a plurality of clock-receiving elements, comprising:

a first temporary wiring section for temporarily wiring a signal line which directly connects said clock-supplying element with each of said clock-receiving elements disposed at predetermined positions, through the shortest path, and fixing the temporary wiring result which should be adopted in after-mentioned final wiring;

a first judgement section for judging whether or not clock skew in said plurality of clock-receiving elements has been optimized by said signal line temporarily wired by said first temporary wiring section;

a first grouping section for dividing said plurality of clock-receiving elements into a plurality of groups when it is judged by said first judgement section that said clock skew has not been optimized;

a first buffer insertion section for (a) assigning a single buffer to each of said groups obtained by said first grouping section, (b) lining-up a plurality of buffer-insertion candidate positions where said buffer can be inserted and disposed, (c) temporarily wiring, for each of the lined-up buffer-insertion candidate positions, both a signal line which connects said buffer, disposed at said buffer-insertion candidate position, with each of said clock-receiving elements belonging to said group through the shortest path, and a signal line which connects said buffer, disposed at said buffer-insertion candidate position, with said clock-supplying element through the shortest path, and fixing the temporary wiring results which should be adopted in after mentioned final wiring, (d) selecting a buffer-insertion candidate position, which can optimize clock skew and clock propagation delay time in said clock-receiving elements belonging to said group, from among said plurality of buffer-insertion candidate positions, based on temporary wiring results obtained for all of said plurality of buffer-insertion candidate positions, to determine the selected buffer-insertion candidate position as a position where said buffer should be actually inserted and disposed, and (e) inserting and disposing said buffer at the selected candidate position, while obtaining the temporary wiring results; and a final wiring section for determining wiring paths of signal lines which connect said clock-supplying element, said plurality of clock-receiving elements, and said buffer, according to the temporary wiring results obtained by said first temporary wiring section and said first buffer insertion section;

wherein said first temporary wiring section, said first judgement section, said first grouping section, and said first buffer insertion section are repeatedly operated, while the buffers inserted into said plurality of groups by said first buffer insertion section are being regarded as said plurality of clock-receiving elements, until it is judged by said first judgement section that the clock skew has been optimized;

and wherein said final wiring section is operated when it is judged by said first judgement the clock skew has been optimized.

11. The apparatus as set forth in claim 10, wherein said first buffer insertion section selects a buffer, which has a characteristic of being able to optimize the clock propagation time from said buffer to said clock-receiving elements belonging to said group, as said buffer that is inserted into said group.

12. The apparatus as set forth in claim 10, further comprising, when said plurality of clock-receiving element belong to different logical hierarchies, an input-terminal setting section for setting, prior to operation of said first temporary wiring section, a virtual input terminal which is connected to said clock-receiving elements belonging to each of said logical hierarchies (hereinafter referred to as hierarchical clock-receiving elements);

a selection section for selecting a plurality of input-terminal disposition candidate positions where said input terminal set by said input-terminal setting section can be disposed;

an input-terminal design section for performing the insertion and disposition of a buffer and the temporary wiring of signal lines between said input terminal disposed at each of said input-terminal dispositions selected by the selection section, and said hierarchical clock-receiving elements disposed at predetermined positions;

a temporary input-terminal wiring section for temporarily wiring a signal line which connects said clock-supplying element with said input terminal disposed at each of said input-terminal disposition candidate positions, through the shortest path; and an input-terminal disposing section for (a) selecting an input-terminal disposition candidate position, which can optimize the clock skew and clock propagation delay time in said hierarchical clock-receiving elements, from among said plurality of input-terminal disposition candidate positions, based on the temporary wiring results obtained for all of said plurality of input-terminal disposition candidate positions by said input-terminal design section and said temporary input-terminal wiring section, (b) disposing said input terminal at the selected candidate position, and (c) adopting the temporary wiring result and the buffer-inserting position obtained for the selected candidate position;

wherein said input-terminal design section comprises
a second temporary wiring section for temporarily wiring a signal line which connects said input terminal, disposed at said input-terminal disposition candidate position, directly with each of said hierarchical clock-receiving elements disposed at predetermined positions, through the shortest path, a second judgement section for judging whether or not clock skew in said hierarchical clock-receiving elements has been optimized by said signal line temporarily wired by said second temporary wiring section, a second grouping section for dividing said hierarchical clock-receiving elements into a plurality of groups when it is judged by said second judgement section that said clock skew has not been optimized, and a second buffer insertion section for (a) assigning a single buffer to each of said groups obtained by said second grouping section, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said hierarchical clock-receiving elements belonging to said group through the shortest path, and a signal line which connects said buffer, disposed at said buffer-insertion candidate position, with said input terminal through the shortest path, (d) selecting a buffer-insertion candidate position, which can optimize clock skew and clock propagation delay time in said hierarchical clock-receiving elements belonging to said group, from among said plurality of buffer-insertion candidate positions, based on temporary wiring results obtained for each of said buffer-insertion candidate positions, and (e) inserting and disposing said buffer at the selected candidate position;

wherein, in said input-terminal design section, said second temporary wiring section, said second judgement section, said second grouping section, and said second buffer insertion section are repeatedly operated, while the buffers inserted into said plurality of groups by said second buffer insertion section are being regarded as said plurality of clock-receiving elements, until it is judged by said second judgement section that the clock skew has been optimized;

and wherein said first temporary wiring section, said first judgement section, said first grouping section, said first buffer insertion section, and said final wiring section are operated, while a plurality of input terminals disposed for each of said logical hierarchies by said input-terminal disposing section are being regarded as said plurality of clock-receiving elements, and said final wiring section determines wiring paths of signal lines, which connect said clock-supplying element, said plurality of clock-receiving elements, said buffer, and said input terminal, according to the temporary wiring result adopted by said input-terminal disposing section, the temporary wiring results obtained by said first temporary wiring section and said first buffer insertion section, and the position of said input terminal.

13. The apparatus as set forth in claim 12, wherein said first temporary wiring section also functions as the temporary input-terminal wiring section and the second temporary wiring section, and said first judgement section, said first grouping section, and said first buffer insertion section also function as said second judgement section, said second grouping section, and said second buffer insertion section, respectively.

14. The apparatus as set forth in claim 13, wherein said second buffer insertion section selects a buffer, which has a characteristic of being able to optimize the clock propagation time from said buffer to said clock-receiving elements belonging to said group, as said buffer that is inserted into said group.

15. The apparatus as set forth in claim 12, wherein said second buffer insertion section selects a buffer, which has a characteristic of being able to optimize the clock propagation time from said buffer to said clock-receiving elements belonging to said group, as said buffer that is inserted into said group.

16. The apparatus as set forth in claim 10, further comprising a clock-supplying-element changing section for changing said clock-supplying element to an element having a characteristic of being able to optimize clock propagation delay time, based on the wiring result obtained by said final wiring section.

17. The apparatus as set forth in claim 10, wherein, when different clock skew restrictions are respectively given to said plurality of clock-receiving elements, the insertion and disposition of said buffer and the determination of the wiring paths of said signal lines are performed so that said restrictions are met.

18. The apparatus as set forth in claim 10, wherein, when said clock-supplying element comprises two or more clock-supplying elements, said clock distributing circuit is designed for each of said two or more clock-supplying elements between the clock-supplying element and the clock-receiving elements to which said clock signal is supplied from the clock-supplying element, and between each of said clock-supplying elements and the clock distributing circuit designed for each of said clock-supplying elements, the insertion and disposition of said buffer and the determination of the wiring path of said signal line are performed so that the clock propagation delay times between the two or more clock-supplying elements and said plurality of clock-receiving elements coincide with each other.

19. An apparatus for designing a clock distributing circuit which distributes and supplies a clock signal from at least one clock-supplying element to a plurality of clock-receiving elements, comprising:

a first temporary wiring section for temporarily wiring a signal line which directly connects said clock-supplying element with each of said clock-receiving elements disposed at predetermined positions, through the shortest path;

a first judgement section for judging whether or not clock skew in said plurality of clock-receiving elements has been optimized by said signal line temporarily wired by said first temporary wiring section;

a first grouping section for dividing said plurality of clock-receiving elements into a plurality of groups when it is judged by said first judgement section that said clock skew has not been optimized;

a first buffer insertion section for (a) assigning a single buffer to each of said groups obtained by said first grouping section, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said clock-receiving elements belonging to said group through the shortest path, and a signal line which connects said buffer, disposed at said buffer-insertion candidate position, with said clock-supplying element through the shortest path, (d) selecting a buffer-insertion candidate position, which can optimize clock skew and clock propagation delay time in said clock-receiving elements belonging to said group, from among said plurality of buffer-insertion candidate positions, based on temporary wiring results obtained for all of said plurality of buffer-insertion candidate positions, and (e) inserting and disposing said buffer at the selected candidate position;

a selection section for selecting, prior to operation of said first temporary wiring section, a plurality of specific-element disposition candidate positions when a specific element is interposed between said clock-supplying element and some of said clock-receiving elements (hereinafter referred to as specific clock-receiving elements);

a specific-element design section for performing the insertion and disposition of a buffer and the temporary wiring of signal lines between said specific element disposed at each of said specific-element dispositions selected by the selection section, and said specific clock-receiving elements disposed at predetermined positions;

a temporary specific-element wiring section for temporarily wiring a signal line which connects said clock-supplying element with said specific element disposed at each of said specific-element disposition candidate positions, through the shortest path; and a specific-element disposing section for (a) selecting a specific-element disposition candidate position, which can optimize the clock skew and clock propagation delay time in said specific clock-receiving elements, from among said plurality of specific-element disposition candidate positions, based on the temporary wiring results obtained for all of said plurality of specific-element disposition candidate positions by said specific-element design section and said temporary specific-element wiring section, (b) disposing said specific element at the selected candidate position, and (c) adopting the temporary wiring result and the buffer-inserting position obtained for the selected candidate position; and a final wiring section for determining wiring paths of signal lines which connect said clock-supplying element, said plurality of clock-receiving elements, and said buffer, according to the temporary wiring results obtained by said first temporary wiring section and said first buffer insertion section;

wherein:

said first temporary wiring section, said first judgement section, said first grouping section, and said first buffer insertion section are repeatedly operated, while the buffers inserted into said plurality of groups by said first buffer insertion section are being regarded as said plurality of clock-receiving elements, until it is judged by said first judgement section that the clock skew has been optimized, and wherein said specific-element design section comprises:

a second temporary wiring section for temporarily wiring a signal line which connects said specific element, disposed at said specific-element disposition candidate position, directly with each of said specific clock-receiving elements disposed at predetermined positions, through the shortest path, a second judgement section for judging whether or not clock skew in said specific clock-receiving elements has been optimized by said signal line temporarily wired by said second temporary wiring section, a second grouping section for dividing said specific clock-receiving elements into a plurality of groups when it is judged by said second judgement section that said clock skew has not been optimized, and a second buffer insertion section for (a) assigning a single buffer to each of said groups obtained by said second grouping section, (b) selecting a plurality of buffer-insertion candidate positions where said buffer can be inserted and disposed, (c) temporarily wiring, for each of the selected buffer-insertion candidate positions, both a signal line which connects said buffer, disposed at said buffer-insertion candidate position, with each of said specific clock-receiving elements belonging to said group through the shortest path, and a signal line which connects said buffer, disposed at said buffer-insertion candidate position, with said specific element through the shortest path, (d) selecting a buffer-insertion candidate position, which can optimize clock skew and clock propagation delay time in said specific clock-receiving elements belonging to said group, from among said plurality of buffer-insertion candidate positions, based on temporary wiring results obtained for each of said buffer-insertion candidate positions, and (e) inserting and disposing said buffer at the selected candidate position;

in said specific-element design section, said second temporary wiring section, said second judgement section, said second grouping section, and said second buffer insertion section are repeatedly operated, while the buffers inserted into said plurality of groups by said second buffer insertion section are being regarded as said plurality of clock-receiving elements, until it is judged by said second judgement section that the clock skew has been optimized;

and said first temporary wiring section, said first judgement section, said first grouping section, said first buffer insertion section, and said final wiring section are operated, while said plurality of clock-receiving elements excluding said specific clocking-receiving element, and said specific element disposed by said specific-element disposing section, are being regarded as said plurality of clock-receiving elements, and said final wiring section determines wiring paths of signal lines, which connect said clock-supplying element, said plurality of clock-receiving elements, said buffer, and said specific element, according to the temporary wiring result adopted by said specific-element disposing section, the temporary wiring results obtained by said first temporary wiring section and said first buffer insertion section, and the position of said specific element, and said final wiring section is operated when it is judged by said first judgement section that the clock skew has been optimized.

20. The apparatus as set forth in claim 19, wherein said first temporary wiring section also functions as the temporary specific-element wiring section and the second temporary wiring section, and said first judgement section, said first grouping section, and said first buffer insertion section also function as said second judgement section, said second grouping section, and said second buffer insertion section, respectively.

21. The apparatus as set forth in claim 20, wherein said second buffer insertion section selects a buffer, which has a characteristic of being able to optimize the clock propagation time from said buffer to said clock-receiving elements belonging to said group, as said buffer that is inserted into said group.

22. The apparatus as set forth in claim 19, wherein said second buffer insertion section selects a buffer, which has a characteristic of being able to optimize the clock propagation time from said buffer to said clock-receiving elements belonging to said group, as said buffer that is inserted into said group.

23. A computer readable storage medium storing a design program which causes a computer to design a clock distributing circuit which distributes and supplies a clock signal from at least one clock-supplying element to a plurality of clock-receiving elements wherein said design program causes said computer to function as a temporary wiring section for temporarily wiring a signal line which directly connects said clock-supplying element with each of said clock-receiving elements disposed at predetermined positions, through the shortest path, and fixing the temporary wiring result which should be adopted in after-mentioned final wiring, a judgement section for judging whether or not clock skew in said plurality of clock-receiving elements has been optimized by said signal line temporarily wired by said temporary wiring section, a grouping section for dividing said plurality of clock-receiving elements into a plurality of groups when it is judged by said judgement section that said clock skew has not been optimized, a buffer insertion section for (a) assigning a single buffer to each of said groups obtained by said grouping section, (b) lining-up a plurality of buffer-insertion candidate positions where said buffer can be inserted and disposed, (c) temporarily wiring, for each of the lined-up buffer-insertion candidate positions, both a signal line which connects said buffer, disposed at said buffer-insertion candidate position, with each of said clock-receiving elements belonging to said group through the shortest path, and a signal line which connects said buffer, disposed at said buffer-insertion candidate position, with said clock-supplying element through the shortest path, and fixing the temporary wiring results which should be adopted in after-mentioned final wiring, (d) selecting a buffer-insertion candidate position, which can optimize clock skew and clock propagation delay time in said clock-receiving elements belonging to said group, from among said plurality of buffer-insertion candidate positions, based on temporary wiring results obtained for all of said plurality of buffer-insertion candidate positions, to determine the selected buffer-insertion candidate position as a position where said buffer should be actually inserted and disposed, and (e) inserting and disposing said buffer at the selected candidate position, while obtaining the temporary wiring results, and a final wiring section for determining wiring paths of signal lines which connect said clock-supplying element, said plurality of clock-receiving elements, and said buffer, according to the temporary wiring results obtained by said temporary wiring section and said buffer insertion section, when it is judged by said judgment section that the clock skew has been optimized;

wherein said computer repeatedly functions as said temporary wiring section, said judgement section, said grouping section, and said buffer insertion section, while the buffers inserted into said plurality of groups by said buffer insertion section are being regarded as said plurality of clock-receiving elements, until it is judged by said judgement section that the clock skew has been optimized;

and wherein said computer functions as said final wiring section when it is judged by said judgement section that the clock skew has been optimized.

24. A method of designing a clock distribution circuit on a semiconductor surface, comprising:

positioning clock elements for the semi-conductor surface;

providing temporary wiring between the clock elements through a shortest signal path;

determining clock skew and propagation delay in the clock distribution circuit; and setting final wiring from the position of the temporary wiring when the clock skew and propagation delay in the clock distribution circuit is optimized.

25. The method of claim 24 wherein if the clock skew and propagation delay has not been optimized, then:

the clock elements include a clock-supplying element, clock-receiving elements, and buffers; and further comprising:
grouping the clock-receiving elements;
assigning a buffer to each group; and
wherein:
positioning includes selecting more than one buffer-insertion position to insert the buffer in each group; and
providing temporary wiring includes providing temporary wiring between the buffers, the clock supplying element, and the clock-receiving elements through a shortest signal path for each buffer-insertion position; and determining clock skew and propagation delay includes determining clock skew and propagation delay in the clock distribution circuit with the buffer for each group inserted and removed from each buffer-insertion position; and further comprising:
selecting a final buffer position from the buffer insertion positions in each group corresponding to optimal clock skew and clock propagation delay time; and
wherein setting final wiring includes setting final wiring between the buffers and the clock-receiving elements and the buffers and the clock-supplying element from the temporary wiring for the buffer-insertion position selected as the final buffer position.

26. The method of claim 25 wherein positioning includes positioning the clock-supplying element and the clock-receiving elements for the semi-conductor surface based on a net list obtained from a logical design.

27. The method of claim 25, further comprising:

selecting several buffer types and wherein determining clock skew and propagation delay includes inserting and removing various buffer types in each buffer-insertion position; and selecting a final buffer type that corresponds with optimal clock skew and clock propagation delay time.

* * * * *